(12) United States Patent
Ikuta

(10) Patent No.: US 9,281,660 B2
(45) Date of Patent: Mar. 8, 2016

(54) SURFACE EMITTING LASER, SURFACE-EMITTING-LASER ARRAY, AND IMAGE FORMING APPARATUS

(71) Applicant: CANON KABUSHIKI KAISHA, Tokyo (JP)

(72) Inventor: Mitsuhiro Ikuta, Cambridge, MA (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/519,609

(22) Filed: Oct. 21, 2014

(65) Prior Publication Data

US 2015/0036711 A1 Feb. 5, 2015

Related U.S. Application Data

(63) Continuation of application No. 13/824,710, filed as application No. PCT/JP2011/073467 on Oct. 5, 2011, now Pat. No. 8,897,330.

(30) Foreign Application Priority Data

Oct. 16, 2010 (JP) ................................. 2010-233164
Sep. 13, 2011 (JP) ................................. 2011-199434

(51) Int. Cl.
| | |
|---|---|
| *H01S 5/00* | (2006.01) |
| *H01S 5/18* | (2006.01) |
| *H01S 5/183* | (2006.01) |
| *B41J 2/455* | (2006.01) |
| *B41J 2/47* | (2006.01) |
| *H01S 3/02* | (2006.01) |
| *H01S 5/42* | (2006.01) |

(52) U.S. Cl.
CPC . *H01S 5/18* (2013.01); *B41J 2/455* (2013.01); *B41J 2/473* (2013.01); *H01S 3/02* (2013.01); *H01S 5/183* (2013.01); *H01S 5/1833* (2013.01); *H01S 5/18361* (2013.01); *H01S 5/18391* (2013.01); *H01S 5/18313* (2013.01); *H01S 5/423* (2013.01); *H01S 2301/16* (2013.01); *H01S 2301/166* (2013.01); *H01S 2301/18* (2013.01)

(58) Field of Classification Search
CPC ... H01S 5/18386; H01S 5/1833; H01S 5/183; H01S 5/08
USPC ....................... 372/50.11, 50.124, 50.1, 46.01
See application file for complete search history.

(56) References Cited

U.S. PATENT DOCUMENTS

| | | | |
|---|---|---|---|
| 8,897,330 B2 * | 11/2014 | Ikuta | 372/50.124 |
| 2007/0014324 A1 * | 1/2007 | Maeda et al. | 372/46.01 |
| 2009/0180506 A1 | 7/2009 | Maeda et al. | |

(Continued)

FOREIGN PATENT DOCUMENTS

| | | |
|---|---|---|
| JP | 2006-019470 | 1/2006 |
| JP | 2006-210429 | 10/2006 |
| JP | 2012-009727 A | 1/2012 |

*Primary Examiner* — Kinam Park
(74) *Attorney, Agent, or Firm* — Canon USA Inc. IP Division

(57) ABSTRACT

The present invention provides a surface emitting laser that provides a sufficient optical output and is suitable as a light source intended for electrophotographic apparatuses, and a surface-emitting-laser array and an image forming apparatus each including the surface emitting laser. The surface emitting laser includes a first stepped structure on a front surface of a front mirror. In the first stepped structure, a difference L between an optical path length in a first area and an optical path length in a second area satisfies the following expression:

$$(\tfrac{1}{4}+N)\lambda < |L| < (\tfrac{3}{4}+N)\lambda$$

where N is an integer.

12 Claims, 25 Drawing Sheets

(56) References Cited

U.S. PATENT DOCUMENTS

| | | |
|---|---|---|
| 2010/0027578 A1 | 2/2010 | Takeuchi |
| 2010/0029027 A1 | 2/2010 | Ikuta et al. |
| 2010/0080258 A1 | 4/2010 | Ikuta |
| 2010/0238965 A1 | 9/2010 | Maeda et al. |
| 2011/0261850 A1 | 10/2011 | Shouji et al. |
| 2013/0177336 A1* | 7/2013 | Ikuta ............................ 399/221 |

\* cited by examiner

FIG. 22A
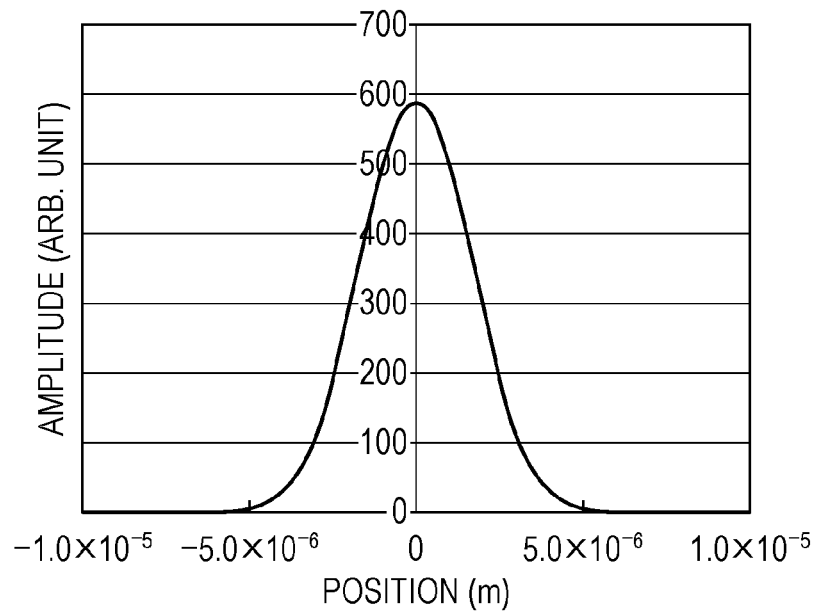
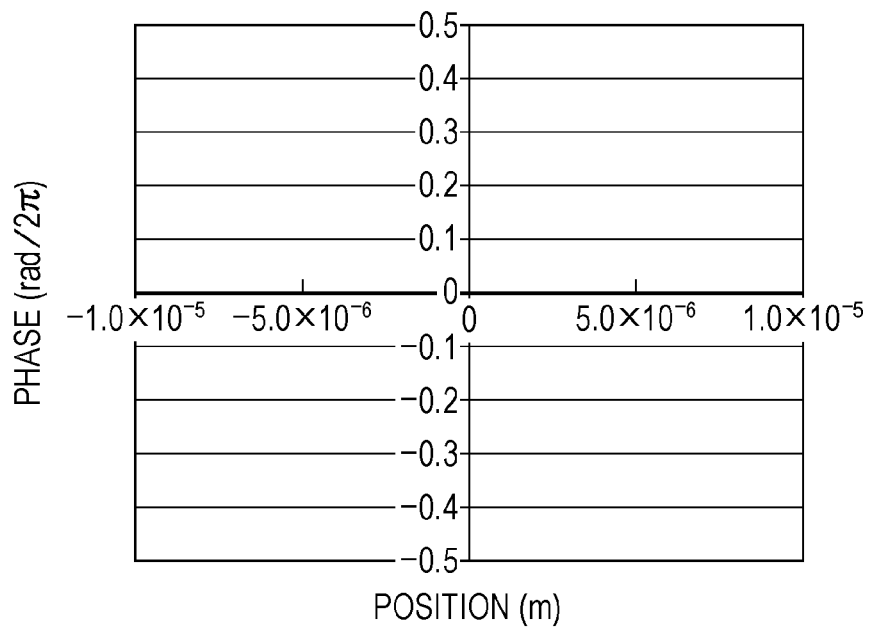

FIG. 22B
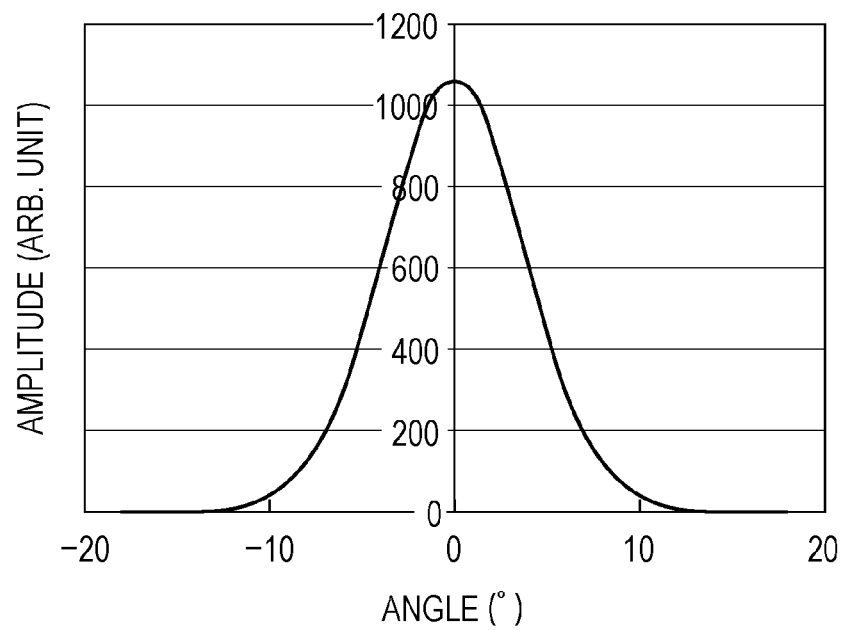
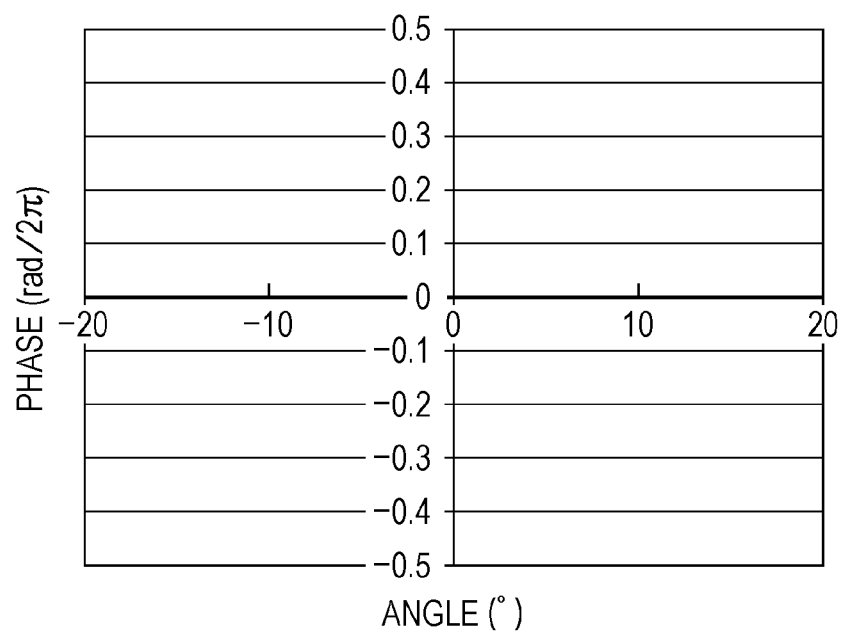

SURFACE EMITTING LASER, SURFACE-EMITTING-LASER ARRAY, AND IMAGE FORMING APPARATUS

CROSS-REFERENCE TO RELATED APPLICATIONS

This application is a Continuation of co-pending U.S. patent application Ser. No. 13/824,710, filed Mar. 18, 2013, which is a U.S. national stage application of International Patent Application No. PCT/JP2011/073467, filed Oct. 5, 2011, which claims the priority benefit of Japanese Patent Applications No. 2011-199434, filed Sep. 13, 2011 and No. 2010-233164, filed Oct. 16, 2010, all of which are hereby incorporated by reference herein in their entirety.

TECHNICAL FIELD

The present invention relates to a surface emitting laser and to a surface-emitting-laser array and an image forming apparatus each including the same.

BACKGROUND ART

Exemplary electrophotographic image forming apparatuses include an optical scanning apparatus. In the optical scanning apparatus, light emitted from a light source is guided to a photosensitive member, whose surface is to be scanned, by a light deflector (a polygon mirror, for example), whereby a latent image is formed.

PTL 1 discloses an image forming apparatus including an array of surface emitting lasers (vertical-cavity surface emitting lasers, abbreviated to VCSELs) as a light source. It is easy to provide a two-dimensional array of VCSELs.

In the above image forming apparatus, a laser beam emitted from the array of surface emitting lasers is collimated into substantially parallel rays by a collimator lens and is then guided to a deflecting surface of a rotating polygon mirror, i.e., a light deflector. The beam deflected by the polygon mirror travels through an imaging optical system (an fθ lens system) and is focused in the form of a spot on a scanning surface. The scanning surface is scanned at a constant speed with the focused beam.

In the above image forming apparatus, the collimated beam emerging from the collimator lens in a sub-scanning direction (contained in a sub-scanning section), which is orthogonal to the deflecting direction (a main scanning direction), is focused on or near the deflecting surface by a cylindrical lens. Subsequently, the beam is refocused on the scanning surface by the imaging optical system. That is, the image forming apparatus employs a tilt correction optical system.

FIG. 21 is a schematic sectional view of a surface emitting laser 1400.

In the surface emitting laser 1400, a plurality of semiconductor layers including a rear mirror 112, an active layer 114, and a front mirror 116 are provided on a semiconductor substrate 110, whereby a vertical cavity is formed. The active layer 114 and the front mirror 116 are partially etched, thereby forming a mesa structure.

A current confinement structure 118 is provided in the front mirror 116. The current confinement structure 118 regulates the electric current flowing through the active layer 114 and defines an emission area of the active layer 114. The current confinement structure 118 is formed by, for example, oxidizing a semiconductor layer made of AlGaAs or the like from the sidewall of the mesa structure.

The current confinement structure 118 formed by oxidizing such a semiconductor layer has a lower refractive index in an insulator portion thereof than in a semiconductor portion thereof. That is, the current confinement structure 118 has a higher refractive index in a central portion thereof than in a peripheral portion thereof. Such a structure is referred to as a waveguide structure. Thus, the current confinement structure 118 defines the profiles of resonance modes of the cavity including a fundamental mode 130.

When an electric current is supplied to the active layer 114 between a rear electrode 120 provided on the rear surface of the substrate 110 and a front electrode 122 provided on the front surface of the front mirror 116, the cavity formed by the combination of the front mirror 116 and the rear mirror 112 causes the surface emitting laser 1400 to oscillate. A protective film 124 made of a dielectric material or the like is provided on the output surface, i.e., the front surface of the front mirror 116.

In a general image forming apparatus including an optical scanning system, a latent image represented by a single-peak pattern is formed on a scanning surface. Therefore, the oscillation mode (the transverse mode) of a surface emitting laser to be utilized is in general the fundamental mode (the lowest-order mode).

As illustrated in FIG. 21, the fundamental mode 130 has a single-peak intensity distribution in the cavity. In general, the profile of the electric field amplitude of the fundamental mode 130 can be approximated to a Gaussian function. That is, a beam emitted from a surface emitting laser that oscillates in the fundamental mode that is a single transverse mode is usually a Gaussian beam.

Here, the complex amplitude (amplitude and phase) of an electric field in a plane immediately after the output surface is referred to as the near field complex amplitude. The amplitude, intensity, and phase of the electric field are referred to as the near field amplitude, the near field intensity, and the near field phase, respectively. The distribution of near field intensity is referred to as the near field pattern (NFP).

Furthermore, the complex amplitude (amplitude and phase) of an electric field in a spherical plane defined by a radius ∞ and centered on the light source is referred to as the far field complex amplitude. The amplitude, intensity, and phase of the electric field are referred to as the far field amplitude, the far field intensity, and the far field phase, respectively. The distribution of far field intensity is referred to as the far field pattern (FFP).

FIG. 22A is a set of graphs representing an exemplary near field complex amplitude (amplitude and phase) of the fundamental mode 130 of the surface emitting laser 1400. FIG. 22B is a set of graphs representing an exemplary far field complex amplitude (amplitude and phase) of the fundamental mode 130 of the surface emitting laser 1400.

A profile 132 representing the near field complex amplitude of the fundamental mode 130 of the surface emitting laser 1400 illustrated in FIG. 21 has a Gaussian shape that is substantially the same as the profile of the fundamental mode 130 in the cavity. According to the Fraunhofer diffraction theory, the near field complex amplitude and the far field complex amplitude are the Fourier transformations of each other. Therefore, if the NFP of a fundamental mode is substantially Gaussian, the FFP of that fundamental mode is also substantially Gaussian. As illustrated in FIGS. 22A and 22B, the phases of the near field complex amplitude and the far field complex amplitude are constant at 0 in this case.

CITATION LIST

Patent Literature

PTL 1 Japanese Patent Laid-Open No. 2007-93770

SUMMARY OF INVENTION

Technical Problem

Regarding the fundamental mode 130 of the surface emitting laser 1400 illustrated in FIG. 21, the beam radius at the NFP and the spread angle of the FFP are inversely correlated with each other. That is, when the beam radius at the NFP becomes larger, the spread angle of the FFP becomes smaller; when the beam radius at the NFP becomes smaller, the spread angle of the FFP becomes larger.

The radius of a Gaussian beam refers to the radius with which the intensity of the beam is $1/e^2$ of the center peak value. The spread angle of the FFP refers to the full width at half maximum of the distribution of far field intensity.

Specifically, regarding a Gaussian beam, the relationship between a beam radius w at the NFP and a spread angle Y of the FFP (herein, the full width at half maximum of the FFP) in a paraxial area is expressed as follows:

$$Y(rad) = (2 \log_e 2)^{1/2} \lambda / \pi w = 0.37 \times \lambda / w$$

where $\lambda$ denotes the wavelength of the laser.

In general, a surface emitting laser has an active region whose length in the direction of light emission is shorter than that of an edge emitting laser. To realize a sufficient optical output, the diameter of the emission area of the surface emitting laser is set to a large value. Therefore, in the surface emitting laser, the beam radius at the NFP tends to be large, whereas the spread angle of the FFP tends to be small.

In a typical electrophotographic apparatus, when the spread angle of the FFP of a laser light source is smaller than the angle defining the entrance pupil of the optical scanning system, the intensity of the laser beam significantly differs between the center and the edge of the entrance pupil. Consequently, the spot size of the beam forming the latent image on the photosensitive member becomes larger than in a case where the intensity of the laser beam is uniform over the entirety of the entrance pupil, leading to a problem that the resolution of the image is reduced.

There is another problem. When the spread angle of the FFP of the laser light source is small, any positional shift of the laser light source attached to the optical system leads to a positional shift of the optical axis of the light source from the optical axis of the optical system. This significantly shifts the intensity distribution within the entrance pupil, resulting in an eccentric intensity distribution.

This problem will now be described in detail with reference to FIGS. 23A to 23D.

FIGS. 23A to 23D schematically illustrate profiles of the far field amplitude. In each of FIGS. 23A to 23D, the angle range corresponding to the entrance pupil is enclosed by a frame 170.

FIGS. 23A and 23B each illustrate a case where the spread angle of the FFP is large. FIGS. 23C and 23D each illustrate a case where the spread angle of the FFP is small. FIGS. 23A and 23C each illustrate a case where the optical axis of the light source coincides with the optical axis of the optical system. FIGS. 23B and 23D each illustrate a case where the optical axis of the light source is shifted from the optical axis of the optical system.

Comparing the cases illustrated in FIGS. 23B and 23D, the variation in the power of the beam traveling through the aperture and the profile eccentricity within the pupil occurring with the positional shift of the optical axis are larger in the case illustrated in FIG. 23D where the spread angle of the FFP is small than in the case illustrated in FIG. 23B where the spread angle of the FFP is large.

As described above, in the surface emitting laser, when the diameter of the emission area is set to a large value so as to provide a sufficient optical output, the beam radius at the NFP becomes large and the spread angle of the FFP becomes small. Consequently, it is difficult to fully use the surface emitting laser as a light source intended for electrophotographic apparatuses.

Accordingly, the present invention provides a surface emitting laser that provides a sufficient optical output and is suitable as a light source intended for electrophotographic apparatuses, and a surface-emitting-laser array and an image forming apparatus each including the surface emitting laser.

Solution to Problem

According to a first aspect of the present invention, a surface emitting laser configured to oscillate at a wavelength $\lambda$ includes a substrate; a multilayer structure provided on the substrate and in which layers including a rear mirror, an active layer, and a front mirror are stacked; and a first stepped structure provided on a front surface of the front mirror and including a portion extending in a first area defined in a central part of an emission area and a portion extending in a second area defined on the outer side of the first area within the emission area, the portions having different heights. In terms of an optical path length from a plane defined on the outside of the surface emitting laser and extending perpendicular to a stacking direction of the multilayer structure to the front surface of the front mirror, a difference L between the optical path length in the first area and the optical path length in the second area satisfies the following expression:

$$(1/4 + N)\lambda < |L| < (3/4 + N)\lambda$$

where N is an integer.

According to a second aspect of the present invention, a surface-emitting-laser array includes a plurality of surface emitting lasers according to the first aspect that are provided at regular intervals in a first direction. The portion of the first stepped structure extending in the first area has an elliptic shape whose minor axis or major axis extends in the first direction.

According to a third aspect of the invention, an image forming apparatus includes a surface emitting laser, and an optical system configured to focus light from the surface emitting laser and to perform scanning with the light. The surface emitting laser is configured to oscillate at a wavelength $\lambda$ and includes a substrate; a multilayer structure provided on the substrate and in which layers including a rear mirror, an active layer, and a front mirror are stacked; and a first stepped structure provided on a front surface of the front mirror and including a portion extending in a first area defined in a central part of an emission area and a portion extending in a second area defined on the outer side of the first area within the emission area, the portions having different heights. In terms of an optical path length from a plane defined on the outside of the surface emitting laser and extending perpendicular to a stacking direction of the multilayer structure to the front surface of the front mirror, a difference L between the optical path length in the first area and the optical path length in the second area satisfies the following expression:

$$(\tfrac{1}{4}+N)\lambda<|L|<(\tfrac{3}{4}+N)\lambda$$

where N is an integer. A radius a of the portion of the first stepped structure extending in the first area satisfies the following expression:

$$a<0.75\lambda\cdot Fno.$$

where Fno. denotes the entrance-side F-number of the optical system.

Advantageous Effects of Invention

According to the above aspects of the present invention, there can be provided a surface emitting laser that provides a sufficient optical output and is suitable as a light source intended for electrophotographic apparatuses, and a surface emitting laser array and an image forming apparatus each including the surface emitting laser.

BRIEF DESCRIPTION OF DRAWINGS

FIG. 22A is a set of graphs representing the near field complex amplitude of the fundamental mode of the known surface emitting laser.

FIG. 22B is a set of graphs representing the far field complex amplitude of the fundamental mode of the known surface emitting laser.

DESCRIPTION OF EMBODIMENTS

Figure 1:
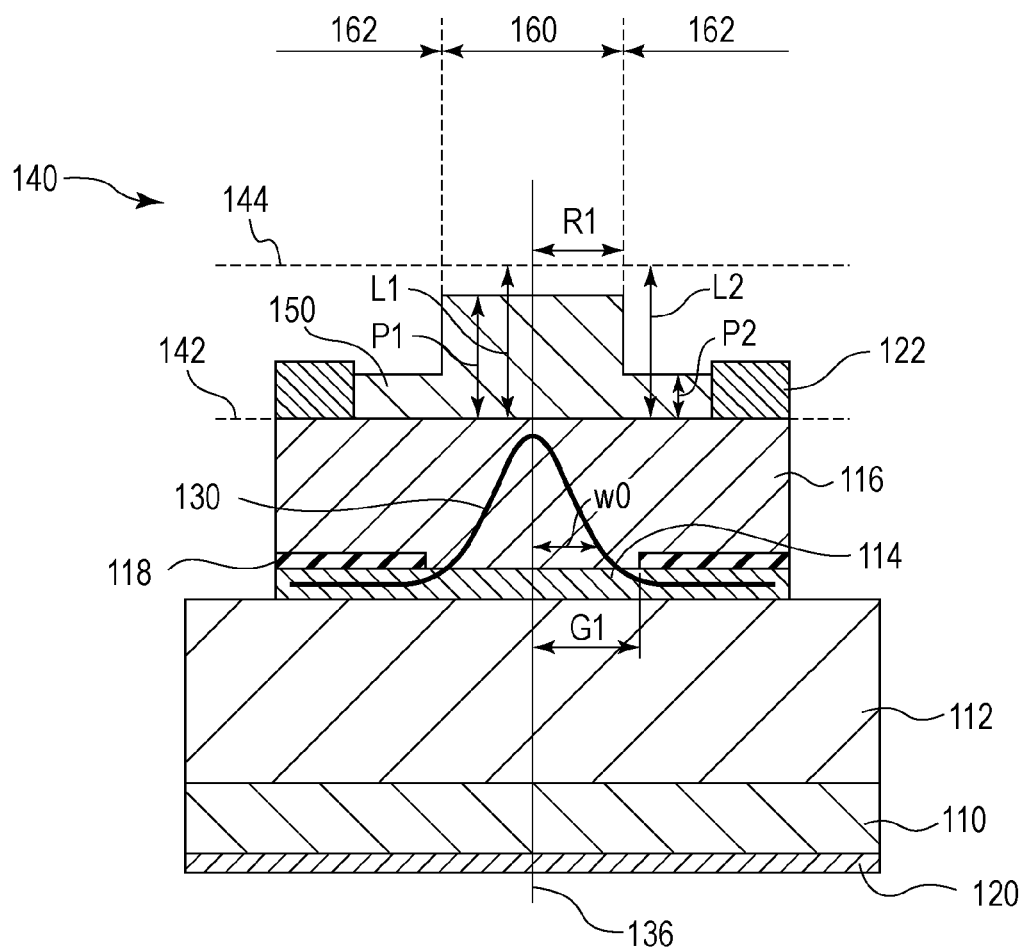
FIG. 1 is a schematic sectional view of a surface emitting laser according to a first embodiment of the present invention.

The problem described above with reference to FIGS. 23A to 23D is pronounced when the FFP of a beam emitted from a laser has a Gaussian shape with a small spread angle. This is because the variation in the intensity of the beam traveling through the entrance pupil in such a case tends to become large with any positional shift of the optical axis of the light source from the optical axis of the optical system. To avoid such a problem, a laser realizing an FFP, i.e., an intensity profile, that is flatter and wider than a Gaussian function representing a resonance mode that is the same as that of the FFP is provided.

Accordingly, a surface emitting laser according to each of embodiments of the present invention described below is configured such that the near field phase is not constant and the absolute value of the phase difference between a transmitted ray in a central portion of the laser and a transmitted ray in a portion around the central portion falls within a range from $(\tfrac{1}{4}+N)2\pi$ to $(\tfrac{3}{4}+N)2\pi$, where N is an integer.

Specifically, the surface emitting laser oscillates at a wavelength $\lambda$ and includes a plurality of flat portions in its output surface and within its emission area. The plurality of flat portions have different heights and in combination form a stepped structure. Thus, an optical path difference L is produced between optical path lengths in central and outer areas, respectively, within the emission area. The optical path difference L satisfies a condition of $(\frac{1}{4}+N)\lambda<|L|<(\frac{3}{4}+N)\lambda$, where N is an integer.

The optical path difference L refers to the difference in the length of the optical path from a reference plane defined on the outside of the surface emitting laser to the rear surface, i.e., the bottom, of the stepped structure between the respective optical paths in the central area and the outer area.

Hence, on the basis of scalar approximation, a phase difference θ is produced that satisfies a condition of $(\frac{1}{4}+N)2\pi<\theta<(\frac{3}{4}+N)2\pi$ between electric fields produced by the respective transmitted rays in the central and outer areas.

By producing such a phase difference in the near field phase, low-spatial-frequency components of the near field complex amplitude are reduced, whereas high-spatial-frequency components of the near field complex amplitude are increased. Accordingly, the far field intensity is lowered in the central area but is increased in the outer area.

Thus, the full width at half maximum of the far field intensity is widened, and the profile of the far field intensity around 0° becomes flatter than the Gaussian profile.

The above effect will now be described by taking specific examples.

One-Dimensional Profile

The effect will first be described in terms of one-dimensional profile. For example, in a case where the emission area has a long narrow shape, the stepped structure is utilized so that the FFP that tends to be narrow is widened in the longitudinal direction.

As an exemplary electric field distribution of the resonance mode, a mode distribution $E_x(x)=g_w(x)$ that is symmetric with respect to x=0 will now be considered. Here, it is supposed that the resonance mode distribution is Gaussian with a spot width w, i.e., $g_w(x)=\exp(-x^2/w^2)$.

The stepped structure has, for example, a width 2a and is centered on the axis of the resonance mode. The phase difference based on the optical path difference L produced by the stepped structure is denoted by θ and is approximated to $\theta=-2\pi L/\lambda$, according to scalar diffraction approximation.

Here, the phase is defined such that the time dependent term of the mode is exp(iωt) in the complex amplitude, where ω denotes angular frequency and t denotes time. The near field complex amplitude based on the above resonance mode distribution and the above stepped structure is denoted by $\Psi_{w,a,\theta}(x)$. According to scalar diffraction approximation, the near field complex amplitude $\Psi_{w,a,\theta}(x)$ is expressed as the resonance mode distribution $g_w(x)$ multiplied by a phase distribution $S_{a,\theta}(x)$ based on the optical path difference L of the stepped structure.

That is, $\Psi_{w,a,\theta}(x)=g_w(x)\cdot S_{a,\theta}(x)$.

The far field complex amplitude determined by the above near field complex amplitude is a Fourier transformation of the near field complex amplitude according to Fraunhofer diffraction approximation, and $F[\Psi_{w,a,\theta}(x)]$ is proportional to $A_{w,a,\theta}(\Omega_x)$.

Here, $F[\Psi_{w,a,\theta}(x)]$ is defined as follows:

$$F[\Psi_{w,a,\theta}(x)]=\int \Psi_{w,a,\theta}(x)\exp(-ix\Omega_x)dx$$

where $\Omega_x$ denotes the spatial angular frequency. Letting the spread angle be $\phi_x$, $\Omega_x=2\pi\phi_x/\lambda$. The far field intensity, denoted by $I_{w,a,\theta}(\Omega_x)$, is proportional to $|A_{w,a,\theta}(\Omega_x)|^2$.

The term $S_{a,\theta}(x)$ denotes the phase distribution to be modulated by the stepped structure and is expressed as follows:

$$S_{a,\theta}(x)=\exp(i\theta/2) \text{ (where } |x|<a)$$

$$S_{a,\theta}(x)=\exp(-i\theta/2) \text{ (where } |x|\geq a)$$

That is, the phase distribution of the resonance mode differs between areas defined with respect to a boundary expressed as x=±a. Although the position of the boundary between different portions of the stepped structure slightly deviates from the position of the boundary in the effective phase distribution depending on the shape of the stepped structure, the two positions are assumed to be the same herein.

Figure 2:
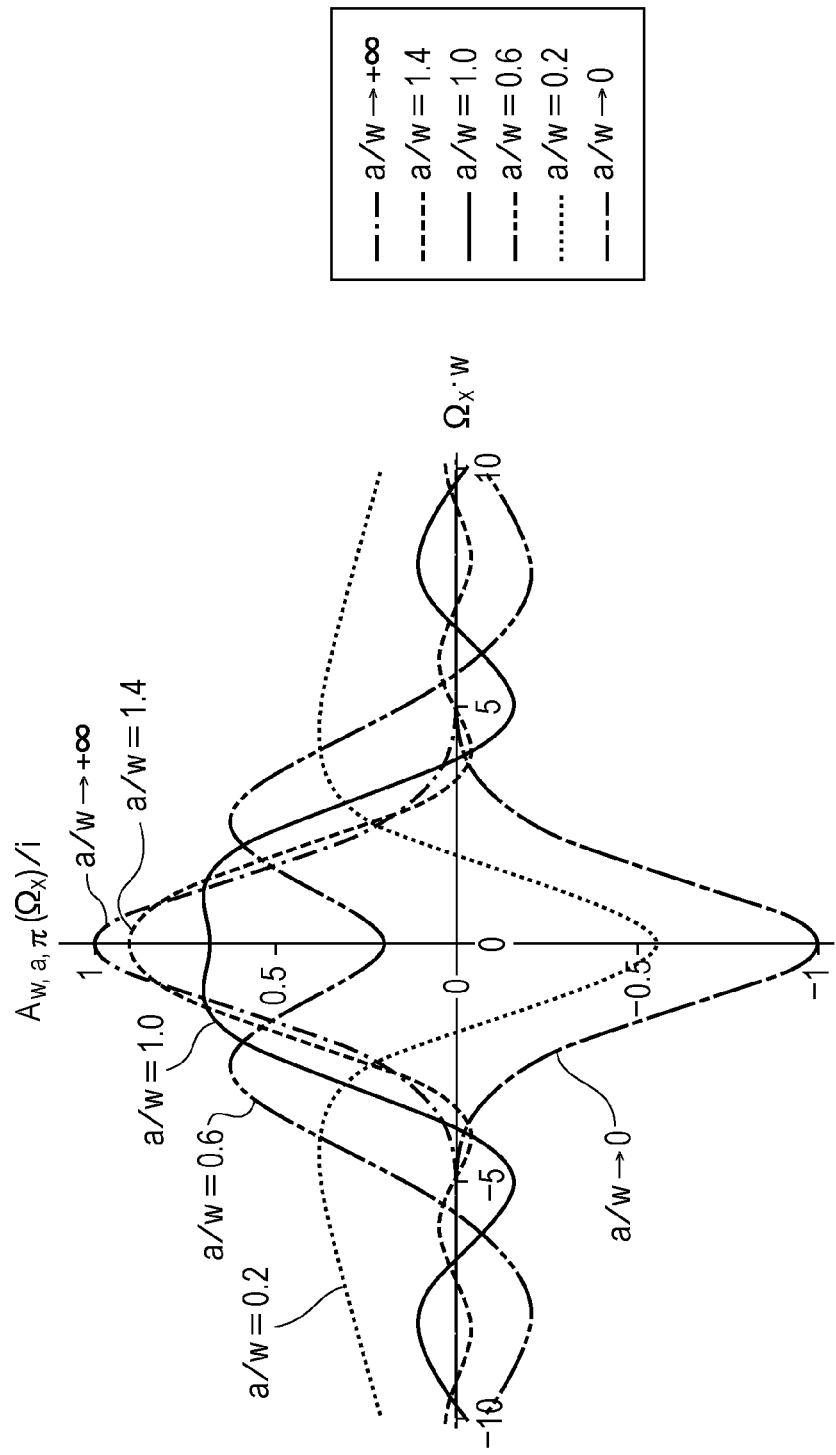
FIG. 2 is a graph illustrating the relationship between $\Omega_x \cdot w$ corresponding to the spread angle and $A_{w,a,\pi}(\Omega_x)/i$ corresponding to the far field amplitude.

The far field intensity based on a stepped structure having a phase difference π will now be considered. FIG. 2 is a graph illustrating the relationship between $\Omega_x$ corresponding to the spread angle and $A_{w,a,\pi}(\Omega_x)$ corresponding to the far field amplitude, i.e., the relationship between $\Omega_x\cdot w$ and $A_{w,a,\pi}(\Omega_x)/i$, with different values of a/w. Note that $A_{w,a,\pi}(\Omega_x)/i=F[\Psi_{w,a,\pi}(x)/i]$.

Figure 3:
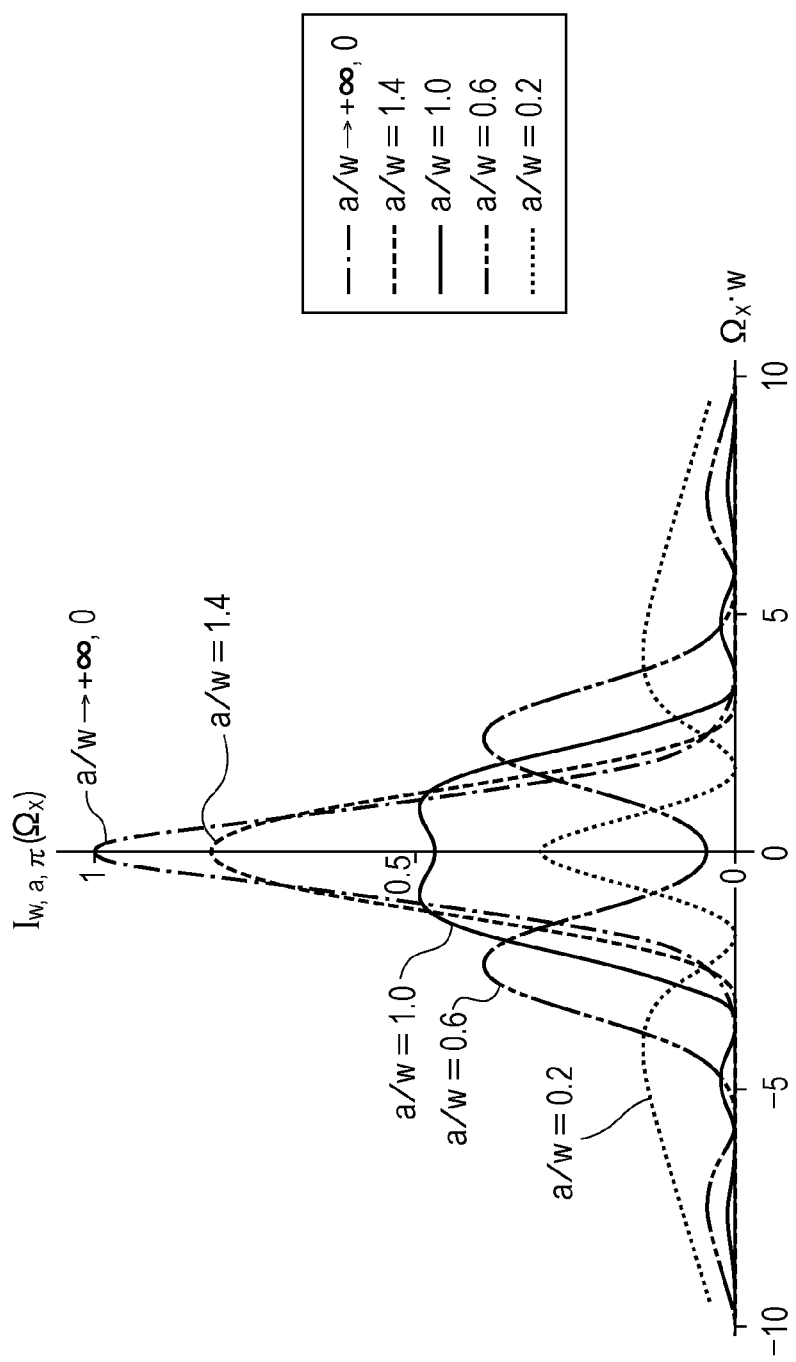
FIG. 3 is a graph illustrating the relationship between $\Omega_x \cdot w$ corresponding to the spread angle and $I_{w,a,\pi}(\Omega_x)$ corresponding to the far field intensity.

FIG. 3 is a graph illustrating the relationship between $\Omega_x$ corresponding to the spread angle and $I_{w,a,\pi}(\Omega_x)$ corresponding to the far field intensity, i.e., the relationship between $\Omega_x\cdot w$ and $I_{w,a,\pi}(\Omega_x)$, with different values of a/w. Note that $I_{w,a,\pi}(\Omega_x)=|A_{w,a,\pi}(\Omega_x)|^2$. In each of FIGS. 2 and 3, the horizontal axis is normalized by multiplying $\Omega_x$ by w.

Referring to FIG. 2, in two cases where the radius of the stepped structure is very large (a/w→+∞) and very small (a/w→0), $A_{w,a,\pi}(\Omega_x)/i$ is $G_w(\Omega_x)$ and $-G_w(\Omega_x)$, respectively. Here, $G_w(\Omega_x)$ is $F[g_w(x)]$. When $g_w(x)$ is $\exp(-x^2/w^2)$, $G_w(\Omega_x)$ is $\exp(-\Omega_x^2 w^2/4)$.

Hence, in each of the two cases, the distribution of far field intensity $I_{w,a,\pi}(\Omega_x)$ illustrated in FIG. 3 becomes Gaussian, that is, the far field intensity distribution in a case where no stepped structure is provided.

When "a" is a finite value, the distribution of $A_{w,a,\pi}(\Omega_x)/i$ is wider than the distribution of $G_w(\Omega_x)$. When a/w is within a range corresponding to $A_{w,a,\pi}(0)/i>0$, the distribution of $I_{w,a,\pi}(\Omega_x)$ is wider than the distribution of far field intensity $I_{w,a,0}(\Omega_x)$ in the case where no stepped structure is provided.

When a/w is substantially larger than 1, the curve of $I_{w,a,\pi}(\Omega_x)$ around $\Omega_x=0$ is has a single peak that is convex upward.

When a/w is substantially smaller than 1 and within the range corresponding to $A_{w,a,\pi}(0)/i>0$, $I_{w,a,\pi}(\Omega_x)$ around $\Omega_x=0$ forms a curve that is convex downward.

Using θ=0 and θ=π, the phase distribution $S_{a,\theta}(x)$ based on the optical path difference L produced by the stepped structure is transformed as follows: $S_{a,\theta}(x)=\cos(\theta/2)S_{a,0}(x)+\sin(\theta/2)S_{a,\pi}(x)$.

According to the linearity of Fourier transformation, the following holds: $A_{w,a,\theta}(\Omega_x)=\cos(\theta/2)A_{w,a,0}(\Omega_x)+\sin(\theta/2)A_{w,a,\pi}(\Omega_x)$.

According to the symmetry (a characteristic as an even and real function) of $g_w(x)$, $A_{w,a,0}(\Omega_x)$ is a real function, and $A_{w,a,\pi}(\Omega_x)$ is a pure imaginary function.

Hence, the following holds: $I_{w,a,\theta}(\Omega_x)=\cos^2(\theta/2)I_{w,a,0}(\Omega_x)+\sin^2(\theta/2)I_{w,a,\pi}(\Omega_x)$.

That is, in the above case, the far field intensity determined by a stepped structure producing a phase difference θ is a combination, at a specific ratio, of the far field intensity $I_{w,a,0}(\Omega_x)$ in the case where no stepped structure is provided and the far field intensity $I_{w,a,\pi}(\Omega_x)$ determined by a stepped structure producing a phase difference π that gives the largest modulation to the near field complex amplitude.

When a/w is such a value that the distribution of $I_{w,a,\pi}(\Omega_x)$ becomes wider than the distribution of $I_{w,a,0}(\Omega_x)$, the distribution of $I_{w,a,0}(\Omega_x)$ is wider than the distribution of $I_{w,a,0}(\Omega_x)$.

Comparing the coefficients of $i_{w,a,0}(\Omega_x)$ and $I_{w,a,\pi}(\Omega_x)$ in the above expression, a condition of $\cos^2(\theta/2)<\sin^2(\theta/2)$ holds when $(\frac{1}{4}+N)2\pi<\theta<(\frac{3}{4}+N)2\pi$. In this case, since $I_{w,a,\theta}(\Omega_x)$ is greatly influenced by $I_{w,a,\pi}(\Omega_x)$, the far field intensity distribution, i.e., the FFP, is widened largely.

In terms of stability in image formation, the FFP is desired to have a large spread angle and particularly to be flat around the center thereof. Specifically, the FFP is desired to be substantially completely flat around the center thereof, more than flatter than that of a Gaussian beam.

As can be seen from FIG. 3, while $I_{w,a,0}(\Omega_x)$ forms a curve that is convex upward around $\Omega_x=0$, $I_{w,a,\pi}(\Omega_x)$ forms a curve whose shape around $\Omega_x=0$ changes from being convex upward to being convex downward with the change in the value of a/w.

This means that, within a specific range of θ, there is a value of "a" that makes the curve of $I_{w,a,\theta}(\Omega_x)$ around the center substantially completely flat.

Letting the second derivative of $I_{w,a,0}(\Omega_x)$ when $\Omega_x=0$ be $I^{(2)}_{w,a,\theta}(0)$, when $I^{(2)}_{w,a,\theta}(0)=0$, the curve of $I_{w,a,\theta}(\Omega_x)$ becomes substantially completely flat at $\Omega_x=0$.

Here, the following holds: $I^{(2)}_{w,a,\theta}(0)=\cos^2(\theta/2)I^{(2)}_{w,a,0}(0)+\sin^2(\theta/2)I_{w,a,\pi}(0)$.

Hence, $I^{(2)}_{w,a,\theta}(0)=0$ is transformed as follows:

$$-1/\tan^2(\theta/2)=I^{(2)}_{w,a,\pi}(0)/I^{(2)}_{w,a,0}(0) \quad \text{Expression (A)}$$

Figure 4:
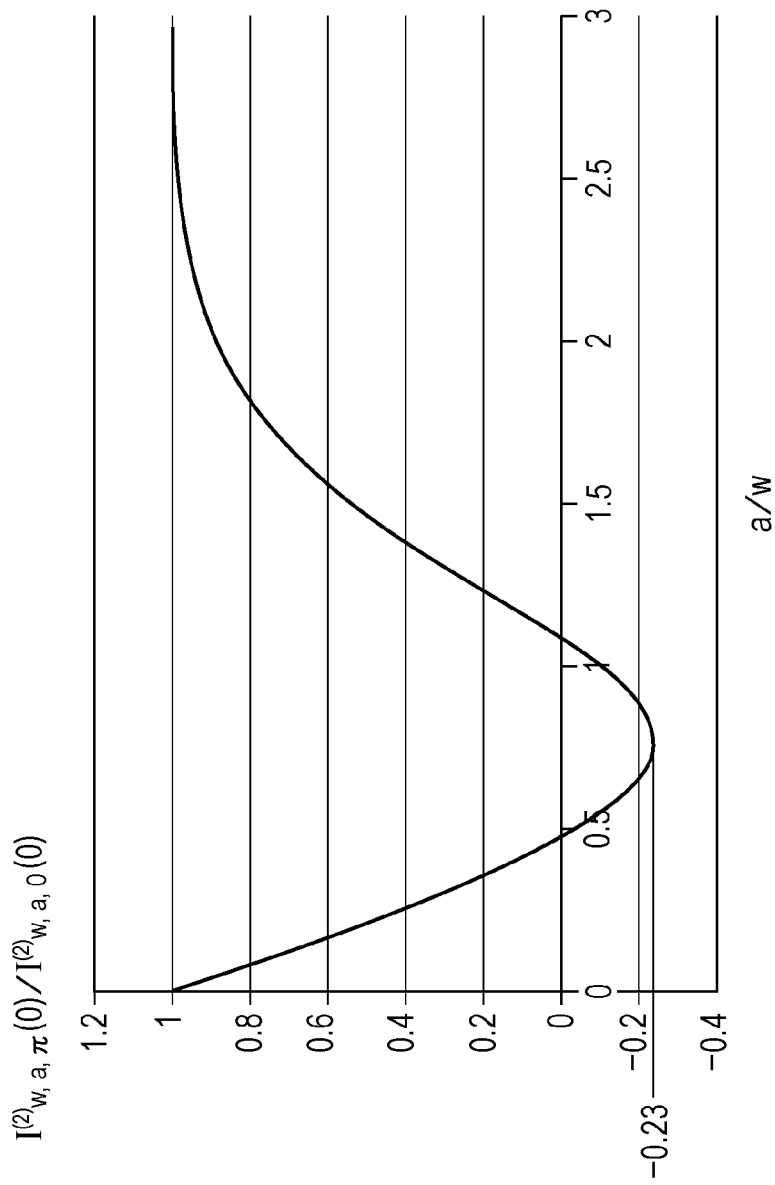
FIG. 4 is a graph of $I^{(2)}_{w,a,\pi}(0)/I^{(2)}_{w,a,0}(0)$ versus a/w.

FIG. 4 is a graph of $I^{(2)}_{w,a,\pi}(0)/I^{(2)}_{w,a,0}(0)$ versus a/w. According to the graph, $I^{(2)}_{w,a,\pi}(0)/I^{(2)}_{w,a,0}(0)$ needs to be larger than −0.23 and is expressed as follows:

$$I^{(2)}_{w,a,\pi}(0)/I^{(2)}_{w,a,0}(0)>-0.23 \quad \text{Expression (B)}$$

According to Expressions (A) and (B), the curve of $I_{w,a,\theta}(\Omega_x)$ can be made substantially completely flat at $\Omega_x=0$ with θ that satisfies a condition of $1/\tan^2(\theta/2)<0.23$, i.e., $0.36\times2\pi<\theta<0.64\times2\pi$.

In terms of optical path length, the above condition is expressed as $(0.36+N)\lambda<|L|<(0.64+N)\lambda$.

The light source intended for electrophotographic apparatuses is desired to have a constant far field phase within the entrance pupil. If there is any phase distribution within the pupil, any positional shift of the optical axis between the light source and the optical system may lead to a positional shift of the spot on the photosensitive member from a predetermined position, depending on the aberration of the optical system. Note that the far field phase corresponds to the difference between the actual wavefront and a reference wavefront within the entrance pupil.

The far field phase is regarded as the argument of $A_{w,a,\theta}(\Omega_x)$.

Here, the real and imaginary parts of $A_{w,a,\theta}(\Omega_x)$ are $\cos(\theta/2)A_{w,a,0}(\Omega_x)$ and $\sin(\theta/2)A_{w,a,\pi}(\Omega_x)/i$, respectively.

Furthermore, $|A_{w,a,\pi}(\Omega_x)/A_{w,a,0}(\Omega_x)|$ is not constant with respect to $\Omega_x$. Hence, when $\theta \neq M\pi$ (where M is an integer), the argument of $A_{w,a,\theta}(\Omega_x)$ is not constant with respect to $\Omega_x$. Accordingly, the far field complex amplitude has a phase distribution. In contrast, when $\theta=M\pi$ (where M is an integer), the far field phase is constant within an area where the argument of $A_{w,a,0}(\Omega_x)$ or $A_{w,a,\pi}(\Omega_x)$ is constant.

In view of the above, it is particularly desirable that the phase difference θ produced by the stepped structure according to any of embodiments of the present invention described below be $(N+\frac{1}{2})2\pi$. In terms of the optical path length, it is particularly desirable that $|L|=(\frac{1}{2}+N)\lambda$ be satisfied.

Even a surface emitting laser whose phase difference θ is not $(N+\frac{1}{2})2\pi$ is satisfactorily usable as a light source intended for electrophotographic apparatuses, depending on the aberration and allowable positional shift of the optical system and the way the orientation of the optical axis of the light source is adjusted in attaching the light source to the optical system.

Furthermore, to suppress changes in characteristics due to positional shift of the stepped structure (a first stepped structure), it is desirable that the boundary between the portions having different heights form a vertical surface. If the boundary forms a sloping surface as a matter of convenience in etching or the like, |L| may be a little larger than $(\frac{1}{2}+N)\lambda$ so that the far field phase becomes constant.

Two-Dimensional Profile

Another case will now be described in which the emission area has a circular shape and a stepped structure having a circular shape is to be provided. As an exemplary electric field distribution of the resonance mode, a mode distribution $E_x(x,y)=g_w(x,y)$ that is symmetric with respect to $x,y=0$ will now be considered. Here, it is supposed that the resonance mode distribution is Gaussian with a spot width w, i.e., $g_w(x,y)=\exp(-\rho^2/w^2)$, where $\rho=(x^2+y^2)^{1/2}$.

The stepped structure has, for example, a radius a and is centered on the axis of the resonance mode. The phase difference based on the optical path difference L produced by the stepped structure and based on scalar diffraction approximation is denoted by θ.

The results of calculations the same as those for the case of the one-dimensional profile will be described below.

Figure 5:
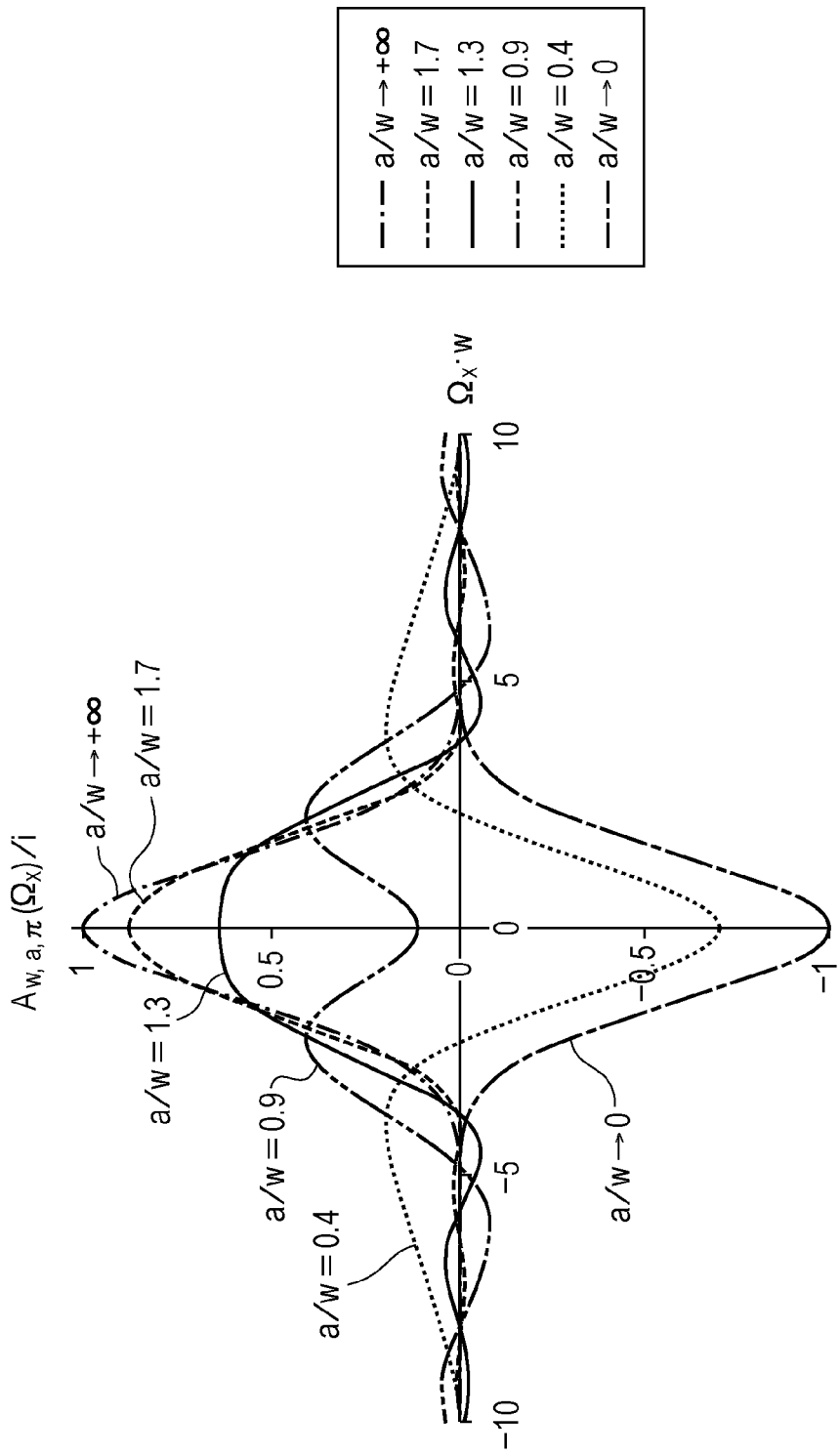
FIG. 5 is another graph illustrating the relationship between $\Omega_x \cdot w$ corresponding to the spread angle and $A_{w,a,\pi}(\Omega_x)/i$ corresponding to the far field amplitude.

FIG. 5 is a graph illustrating the relationship between $\Omega_x \cdot w$ and $A_{w,a,\pi}(\Omega_x)/i$ with different values of a/w. Note that $A_{w,a,\pi}(\Omega_x)/i=F[\Psi_{w,a,\pi}(x)/i]$.

Figure 6:
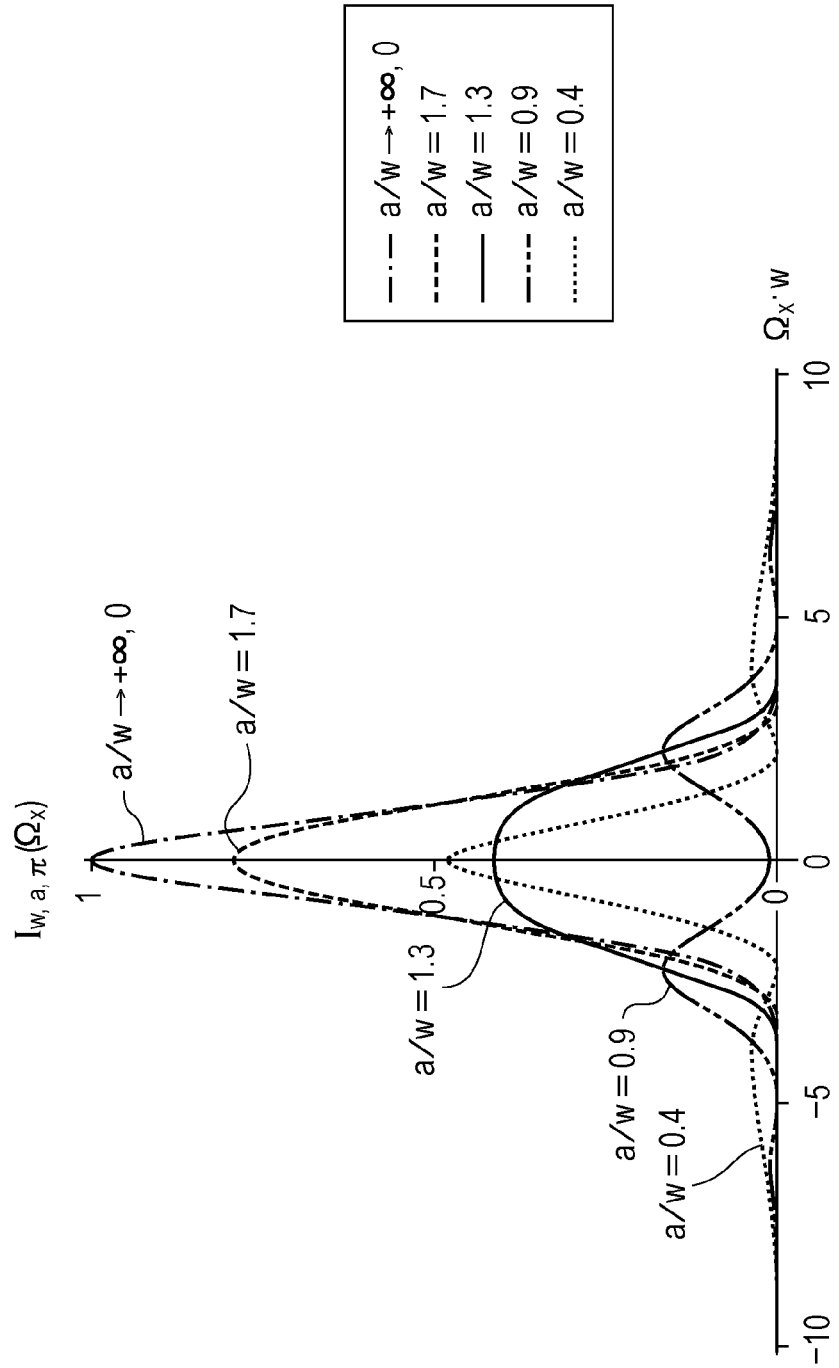
FIG. 6 is another graph illustrating the relationship between $\Omega_x \cdot w$ corresponding to the spread angle and $I_{w,a,\pi}(\Omega_x)$ corresponding to the far field intensity.

FIG. 6 is a graph illustrating the relationship between $\Omega_x \cdot w$ and $I_{w,a,\pi}(\Omega_x)$ with different values of a/w. Note that $I_{w,a,\pi}(\Omega_x)=|A_{w,a,\pi}(\Omega_x)|^2$ and the second derivative of $I_{w,a,\theta}(\Omega_x)$ when $\Omega_x=0$ and $\Omega_y=0$ is denoted by $I^{(2)}_{w,a,\theta}(0)$.

Figure 7:
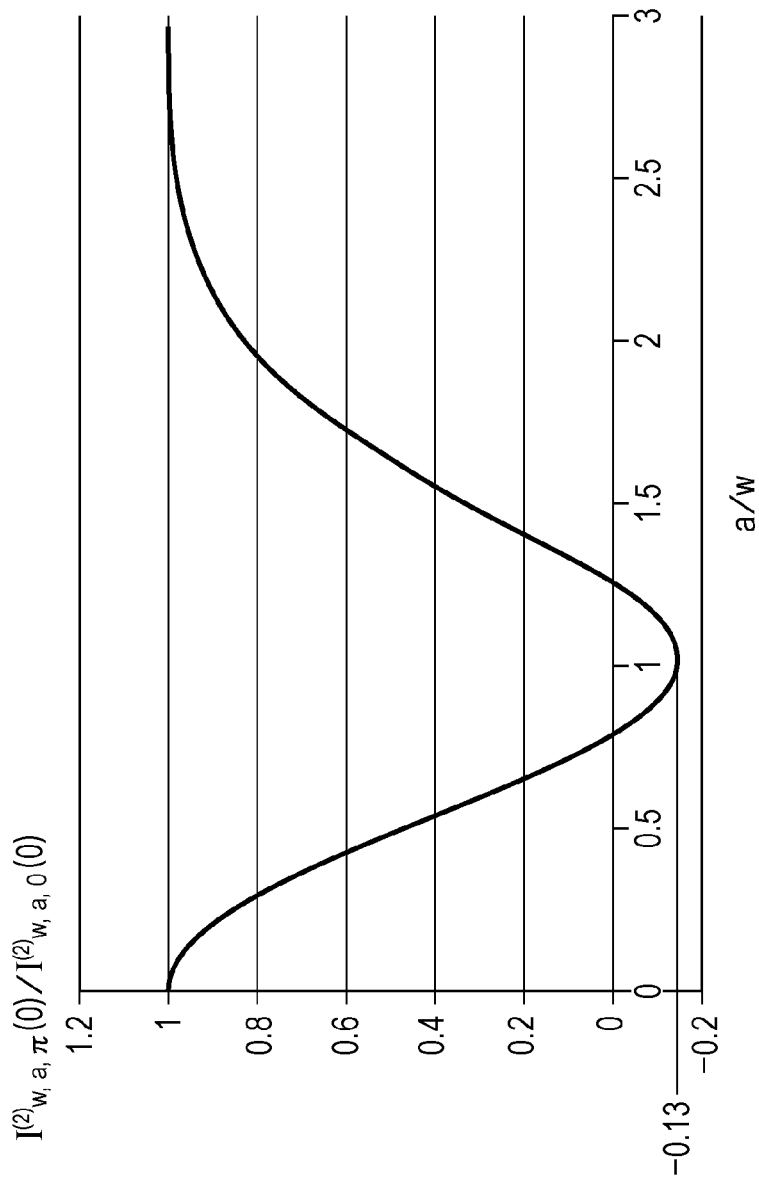
FIG. 7 is another graph of $I^{(2)}_{w,a,\pi}(0)/I^{(2)}_{w,a,0}(0)$ versus a/w.

FIG. 7 is a graph of $I^{(2)}_{w,a,\pi}(0)/I^{(2)}_{w,a,0}(0)$ versus a/w. FIG. 7 shows that $I^{(2)}_{w,a,\pi}(0)/I^{(2)}_{w,a,0}(0)>-0.13$.

Hence, the curve of $I_{w,a,\theta}(\Omega_x)$ is substantially completely flat when $\Omega_x=0$ and $\Omega_y=0$ with θ that satisfies $1/\tan^2(\theta/2)<0.13$, i.e., $0.39\times2\pi<\theta<0.61\times2\pi$.

In terms of optical path length, the above condition is expressed as $(0.39+N)\lambda<|L|<(0.61+N)\lambda$.

In this case also, it is particularly desirable that the phase difference θ produced by the stepped structure be $(N+\frac{1}{2})2\pi$ so that the far field phase becomes constant.

Note that the actual near field complex amplitude may include an oscillation containing high-spatial-frequency components, in addition to a near field complex amplitude obtained by scalar diffraction approximation, because of scattering at the edges of the stepped structure or the like.

Such high-spatial-frequency components, however, are reflected on components spreading outward in the far field (i.e., components that do not enter the optical system). Therefore, the influence of such high-spatial-frequency components is negligible in the far field complex amplitude.

Note that the shape of the stepped structure according to the present invention that produces the above-described effects is not limited to the circular columnar shape described above, and may alternatively be an elliptic or rectangular columnar shape.

For example, in a case of an elliptic columnar shape, the far field complex amplitude changes more significantly in the direction of the minor axis of the ellipse than in the direction of the major axis of the ellipse. That is, the width of the far field intensity distribution can be increased more in the direction of the minor axis. Therefore, if the pupil of the optical system of an image forming apparatus has an asymmetrical shape, a more efficient light source can be provided by making the minor axis of the ellipse extend in a direction in which the far field intensity distribution is desired to be widened more.

First Embodiment

FIG. 1 is a schematic sectional view of a surface emitting laser 100 according to a first embodiment of the present invention.

The surface emitting laser 100 according to the first embodiment includes a semiconductor substrate 110 and a rear mirror 112, an active layer 114, and a front mirror 116 that are sequentially provided on the substrate 110.

A fundamental mode 130 of the surface emitting laser 100 has an oscillation wavelength λ of, for example, 680 nm. The semiconductor substrate 110 is, for example, an n-GaAs substrate. For the convenience of controlling the polarization of the surface emitting laser 100, the normal to the ground surface of the GaAs substrate is tilted by 10 degrees in such a manner as to extend in a crystal orientation of [0-1-1] with respect to a crystal orientation of [100].

The rear mirror 112 is a semiconductor multilayer mirror including, for example, 70 pairs of n-$Al_{0.5}Ga_{0.5}As$ and AlAs films that each have an optical thickness of λ/4 and are stacked alternately.

The active layer 114 is a multiple-quantum-well structure made of GaInP and AlGaInP films.

The front mirror 116 is a semiconductor multilayer mirror including, for example, 35 pairs of p-$Al_{0.5}Ga_{0.5}As$ and $Al_{0.9}Ga_{0.1}As$ films that each have an optical thickness of λ/4 and are stacked alternately.

The front mirror 116 and the active layer 114 are provided in the form of a cylindrical mesa structure.

A front electrode 122 is provided on the front surface, i.e., at the top, of the front mirror 116. A rear electrode 120 is provided on the rear surface, i.e., at the bottom, of the substrate 110.

The front electrode 122 and the rear electrode 120 are multilayer structures of, for example, Ti/Pt/Au and AuGe/Au, respectively. The front electrode 122 has an opening, from which a laser beam is emitted.

A layer of $Al_{0.98}Ga_{0.02}As$ is provided between the front mirror 116 and the active layer 114 or in the front mirror 116. By oxidizing the $Al_{0.98}Ga_{0.02}As$ layer from the sidewall of the mesa structure, a circular current confinement structure 118 is formed. A part of the current confinement structure 118 is therefore oxidized. The other part, i.e., an unoxidized part, of the current confinement structure 118 has a radius G1 of, for example, 2.8 μm.

The oxidized part has a much smaller refractive index than the unoxidized part, producing a refractive index distribution. The refractive index distribution determines the transverse mode of the surface emitting laser 100.

Although the profile of the fundamental mode 130 within the cavity changes with the position and thickness of the current confinement structure 118 formed by oxidization, the profile can be approximated to a Gaussian function.

The center of the fundamental mode 130 within the emission area (an optical axis 136 of the light source) substantially coincides with the center of the current confinement structure 118.

The fundamental mode 130 has a Gaussian profile with a spot radius $w_0$ (the radius with which the electric field intensity becomes $1/e^2$ of the center peak value) of, for example, 2.3 μm. A circular stepped structure 150 made of a single material (a first material) is provided on a front surface 142 of the front mirror 116.

The center of the stepped structure 150 substantially coincides with the center of current confinement structure 118. The stepped structure 150 has a radius R1 of, for example, 3.0 μm.

The first material is, for example, SiO and has a refractive index $n_1$ of, for example, 1.5.

An environmental medium 140 in which the surface emitting laser 100 is installed is, for example, air and has a refractive index $n_0$ of 1.

The stepped structure 150 has a convex shape with an actual thickness P1 in a first area 160 defined in the center of the emission area and an actual thickness P2 in a second area 162 defined on the outer side of the first area 160 within the emission area. With the presence of the stepped structure 150, there is a difference in the length of the optical path of the beam from the output surface of the surface emitting laser 100 between an optical path in the first area 160 and an optical path in the second area 162. The optical path difference, denoted by L, is expressed as L=|L1−L2|.

Here, L1 denotes the optical path length in the first area 160 from the front surface 142 of the front mirror 116 to a plane 144, and L2 denotes the optical path length in the second area 162 from the front surface 142 to the plane 144. The plane 144 is a reference plane that is defined on the outside of the surface emitting laser 100 and is perpendicular to a stacking direction in which the layers included in the surface emitting laser 100 are stacked.

In the configuration illustrated in FIG. 1, the environmental medium 140 is common to the first area 160 and the second area 162. Hence, the optical path difference L is calculated from the following expression:

$$L=|L1-L2|=n_1 \times (P1-P2) - n_0 \times (P1-P2)$$

The stepped structure 150 produces a phase difference θ of $(1/4+N)2\pi < \theta < (3/4+N)2\pi$ (where N is an integer) between the electric field amplitude of the transmitted ray in the first area 160 and the electric field amplitude of the transmitted ray in the second area 162.

Therefore, to put it in terms of optical path length, P1 and P2 are to be adjusted such that the optical path difference L satisfies the following expression:

$$(1/4+N)\lambda < L < (3/4+N)\lambda \text{ (where } N \text{ is an integer)}$$

The smaller the integer N is set, the more the scattering loss at the edges of the stepped structure 150 is suppressed. For example, N may be set to 0.

Supposing that $P1=2\lambda/n_1$ and $P2=0.5\lambda/n_1$, the following holds: $L=|L1-L2|=n_1 \times (P1-P2) - n_0 \times (P1-P2)=0.5\lambda$.

The optical path difference L expressed as above gives the near field complex amplitude a phase difference $\theta=L/\lambda \times 2\pi$ [rad] between the electric field amplitude of the transmitted ray in the first area 160 and the electric field amplitude of the transmitted ray in the second area 162. Specifically, in the above numerical example, θ is π, and a phase difference of $(1/4+N)2\pi < \theta < (3/4+N)2\pi$ is given.

Figure 8:
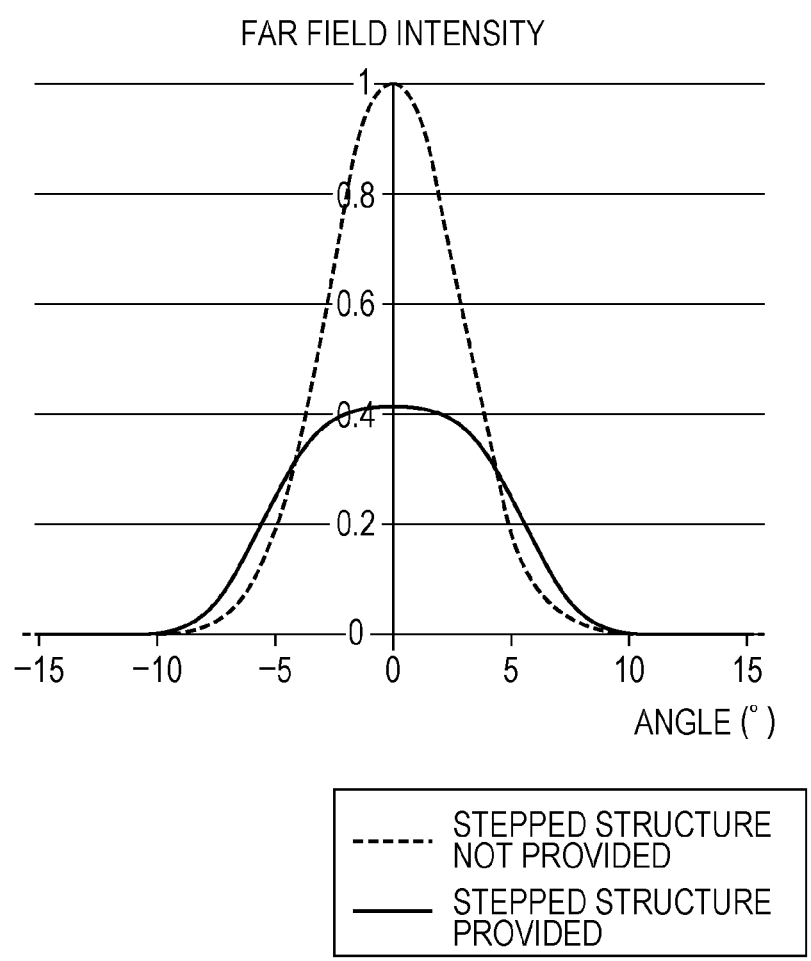
FIG. 8 illustrates the results of calculating FFPs.

FIG. 8 illustrates the results of calculating the far field intensity distributions, i.e., FFPs, in a case where the stepped structure 150 is not provided and in a case where the stepped structure 150 is provided. The far field phases in the two cases are constant. Comparing the two cases, the presence of the stepped structure 150 makes the far field intensity distribution wider with a full width at half maximum of about 1.9 times that of the far field intensity distribution in the case where the stepped structure 150 is not provided.

The presence of the stepped structure 150 also makes the far field intensity profile around the optical axis 136 (around 0°) substantially flat.

Modifications

Figure 9:
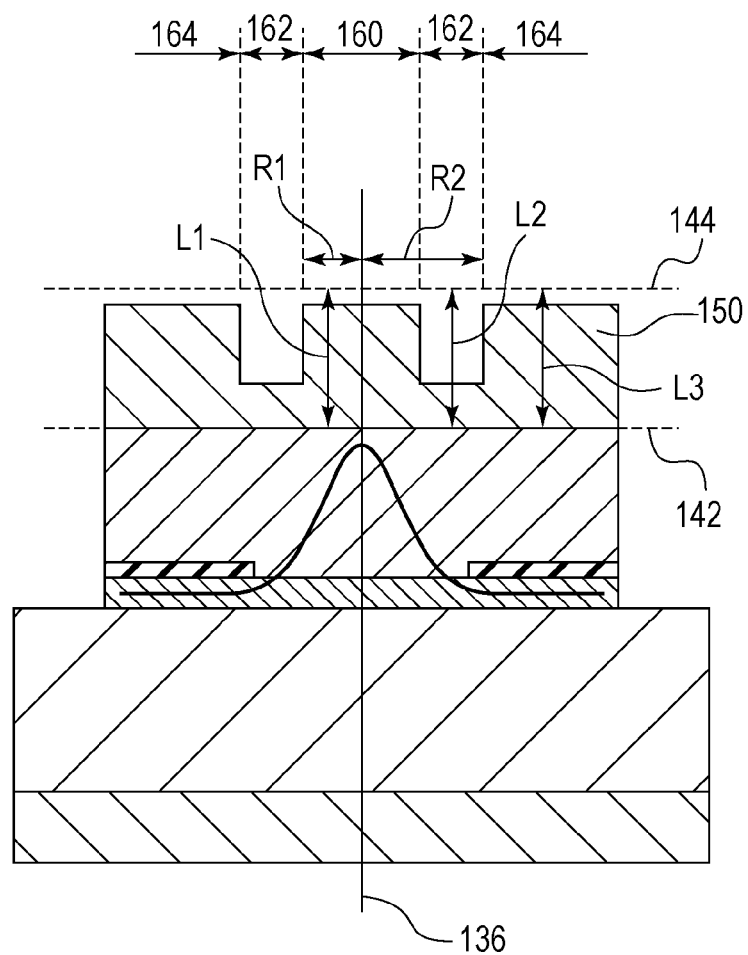
FIG. 9 is a schematic sectional view of a surface emitting laser according to a modification of the first embodiment.

FIG. 9 illustrates a modification of the stepped structure 150. In the modification, the FFP, illustrated in FIG. 8, in the case where the stepped structure 150 is provided is made much wider.

Specifically, the stepped structure 150 is configured such that the electric field complex amplitude of a transmitted ray in the first area 160 defined in the center of the emission area and the electric field complex amplitude of a transmitted ray in the second area 162 defined on the outer side of the first area 160 contain respective components having opposite signs, and such that the electric field complex amplitude of the transmitted ray in the second area 162 and the electric field complex amplitude of a transmitted ray in a third area 164 defined on the outer side of the second area 162 contain respective components having opposite signs. Considering this, optical path lengths L1, L2, and L3 illustrated in FIG. 9 are set.

Specifically, an optical path difference L' between the optical path length L2 in the second area 162 and the optical path length L3 in the third area 164 satisfies the following expression:

$$(N+\tfrac{1}{4})\lambda < |L'| < (N+\tfrac{3}{4})\lambda \text{ (where } N \text{ is an integer)}$$

Suppose that the fundamental mode of a beam at a wavelength of 680 nm in the cavity is Gaussian and the beam has a width w of 2.3 µm, and that a distance R1 from the optical axis 136 of the light source to the boundary between the first area 160 and the second area 162 is 2.3 µm and a distance R2 from the optical axis 136 of the light source to the boundary between the second area 162 and the third area 164 is 3.8 µm. In this case, to make the phase difference between the transmitted rays in each pair of adjacent areas be $\pi$, a relationship of $|L1-L2|=|L3-L2|=\lambda/2$ is established.

Figure 10:
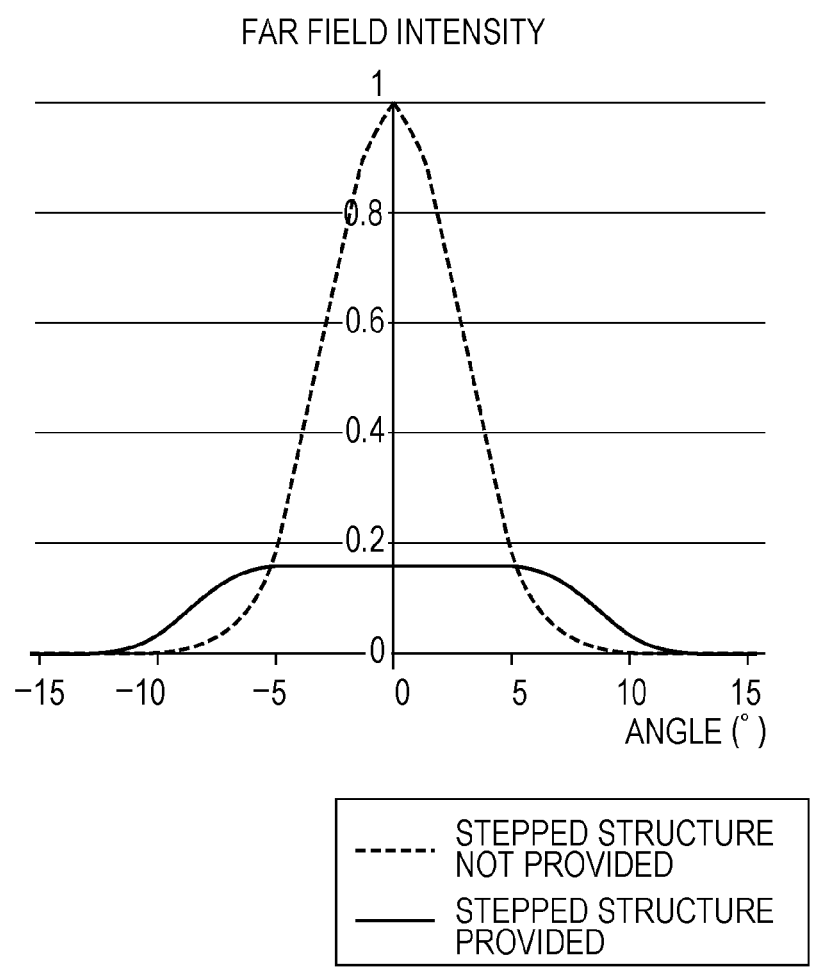
FIG. 10 illustrates the results of calculating FFPs.

FIG. 10 illustrates the far field intensity distributions, i.e., FFPs, in two cases where the above stepped structure 150 is provided and not provided. The far field phases in the two cases are constant.

The full width at half maximum of the FFP in the case where the stepped structure 150 according to the above numerical example is provided is about 2.6 times that in the case where the stepped structure 150 is not provided. Thus, the FFP is widened more than in the case of the stepped structure 150 illustrated in FIG. 1.

Figure 11:
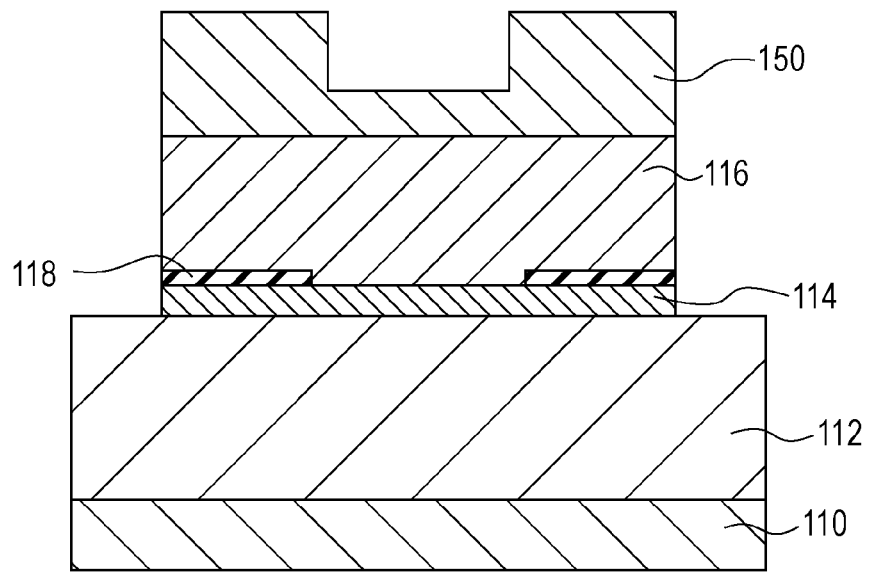
FIG. 11 illustrates a surface emitting laser including a stepped structure whose optical path length is shorter in a central portion.

The stepped structures 150 illustrated in FIGS. 1 and 9 each have a convex shape in which the optical path length is longer in the central area than in the outer area. Alternatively, the stepped structure 150 may have a concave shape, as illustrated in FIG. 11, in which the optical path length is shorter in the central area than in the outer area.

In such a case, the sign of the far field phase distribution is reversed, but the intensity distribution is maintained to be the same.

Although the deviation of the position of the boundary between different portions of the stepped structure 150 from the position of the boundary in the effective phase distribution is slightly different between the stepped structure 150 having the convex shape and the stepped structure 150 having the concave shape, the deviation in the two cases are assumed to be the same herein.

Figure 12:
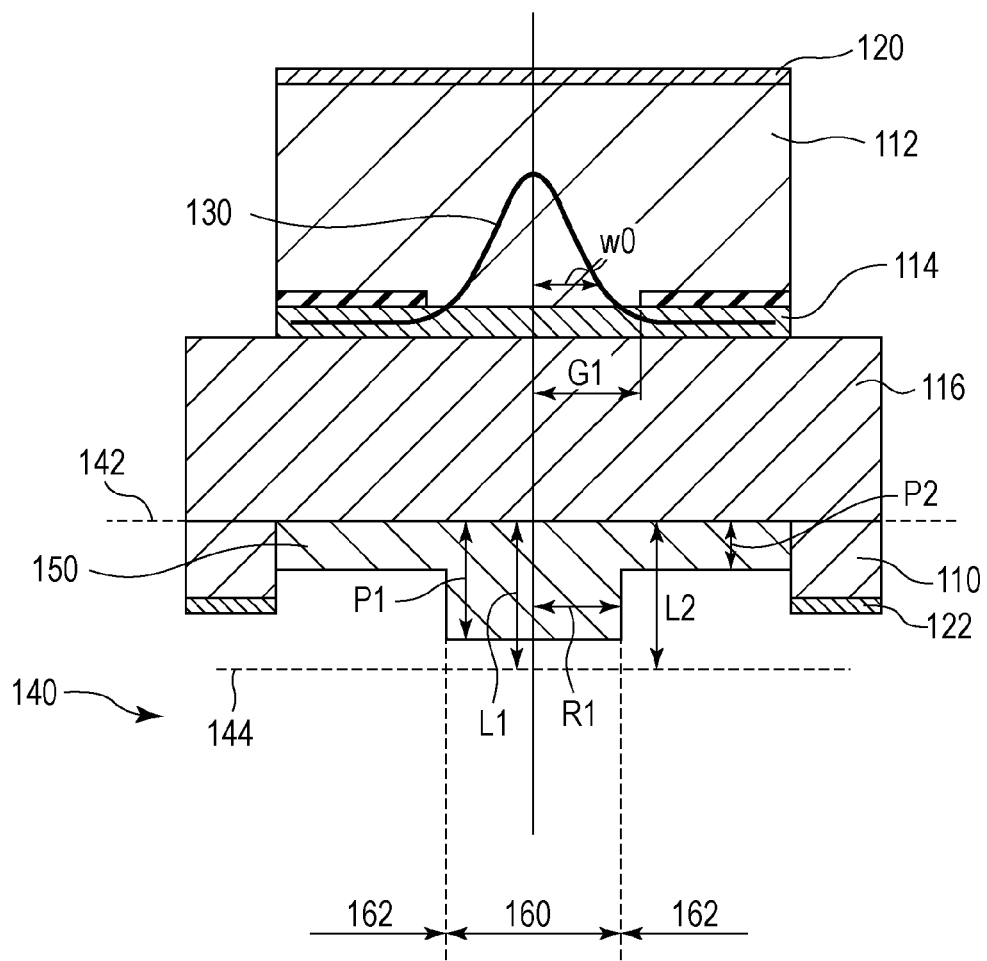
FIG. 12 illustrates a surface emitting laser in which a stepped structure is provided on the side of a substrate.

Referring to FIG. 12, the surface emitting laser according to the first embodiment of the present invention may be configured to emit a beam from the side of the substrate 110. In such a case also, the side from which the beam is emitted is referred to as the front side. Accordingly, with respect to the active layer 114, the front mirror 116 refers to the mirror provided on the side from which the beam is emitted, not the mirror provided on the upper side of the laser in the installed orientation.

For example, the substrate 110 and the front mirror 116 are n-type semiconductors, and the rear mirror 112 is a p-type semiconductor. The portions of the substrate 110 and the front electrode 122 within the emission area are removed. The other members are configured appropriately, as described above.

Reflectance Distribution

The reflectance of the front mirror 116, i.e., the mirror on the front side with respect to the active layer 114, may have a distribution depending on the shape of the stepped structure 150.

For example, when the actual thicknesses P1 and P2 of the stepped structure 150 illustrated in FIG. 1 are set such that $|n_1 \cdot P1 - n_1 \cdot P2|$ becomes an integral multiple of $\lambda/2$, the front mirror 116 has substantially no reflectance distribution.

If the occurrence of reflectance distribution in the front mirror 116 due to the stepped structure 150 is suppressed as much as possible, the influence of the stepped structure 150 upon the resonance mode in the cavity is reduced.

The reflectance distribution may not necessarily be completely eliminated. Depending on situations, some reflectance distribution may be given so as to obtain desired characteristics. For example, if the reflectance in the outer area is made lower than that in the central area, a loss is selectively given to a higher-order mode.

In a case where the transmittance in the outer area is higher than the transmittance in the central area, the influence of the transmitted ray in the outer area increases. In such a case, the FFP is flattened by employing a stepped structure having a larger radius than a stepped structure that flattens the FFP in a case where the transmittances in the outer area and the central areas are the same.

Manufacturing Method

A method of manufacturing the surface emitting laser 100 according to the first embodiment described above with reference to FIG. 1 will now be described.

Semiconductor layers that function as the rear mirror 112, the active layer 114, and the front mirror 116, respectively, are grown on the semiconductor substrate 110. The growth of grains is performed by metal-organic chemical vapor deposition (MOCVD) or the like.

A semiconductor layer (functioning as the current confinement structure 118) containing more Al components than the layers functioning as the front mirror 116 and the rear mirror 112 is provided in the front mirror 116 or between the rear mirror 112 and the active layer 114. The above semiconductor layers are formed into a mesa structure such that the sidewall of the current confinement structure 118 is exposed to the outside.

The mesa structure is formed by, for example, a photolithographic technique such as dry etching. The mesa structure has a cylindrical shape with a diameter of, for example, 30 µm.

The layer functioning as the current confinement structure 118 in the mesa structure is oxidized from the sidewall thereof in a high-temperature water-vapor atmosphere, whereby the current confinement structure 118 is obtained. The oxidization is performed at, for example, 450° C. The radius of the current confinement structure 118 is, for example, 2.8 µm.

A dielectric film is deposited on the front mirror 116 included in the mesa structure, and is formed into the stepped structure 150 having the above-described shape. The dielectric film is composed of SiO, SiN, or the like and is deposited by plasma chemical vapor deposition (CVD) or suppering.

If conditions for plasma CVD or the like in depositing the film of SiO or the like are changed, the refractive index $n_1$ of the stepped structure 150 can be adjusted. For example, if $n_1$ is set to 1.5, a phase difference of 180° is produced, with $n_1 \cdot P1$ and $n_1 \cdot P2$ being integral multiples of $\lambda/2$. In this case, P1 is $2\lambda/n_1$ and P2 is $0.5\lambda/n_1$.

Furthermore, SiO has a refractive index of about 1.5, satisfying the above condition, and can be suitably used as a highly durable protective film.

The stepped structure 150 is formed by etching, lift-off, or the like.

For example, a first dielectric film having a thickness corresponding to (P1−P2) is deposited on the mesa structure. Subsequently, a portion of the first dielectric film in the outer area is etched off. Then, a second dielectric film having a thickness corresponding to P2 is deposited over the resultant of the first dielectric film. Alternatively, a first dielectric film having a thickness corresponding to P2 is deposited on the mesa structure. Subsequently, a resist pattern intended for lift-off is formed on a portion of the mesa structure in the outer area. Furthermore, a second dielectric film having a thickness corresponding to (P1−P2) is deposited on the resist pattern. Then, the lift-off resist pattern is removed.

After forming the stepped structure 150 as described above, the front electrode 122 is provided on the front surface of the front mirror 116 included in the mesa structure, and the rear electrode 120 is provided on the rear surface of the substrate 110. The rear electrode 120 and the front electrode 122 are formed by vapor deposition or the like.

The surface emitting laser 100 including the stepped structure 150 and the current confinement structure 118 may further include a second transverse-mode-controlling mechanism.

Figure 14A:
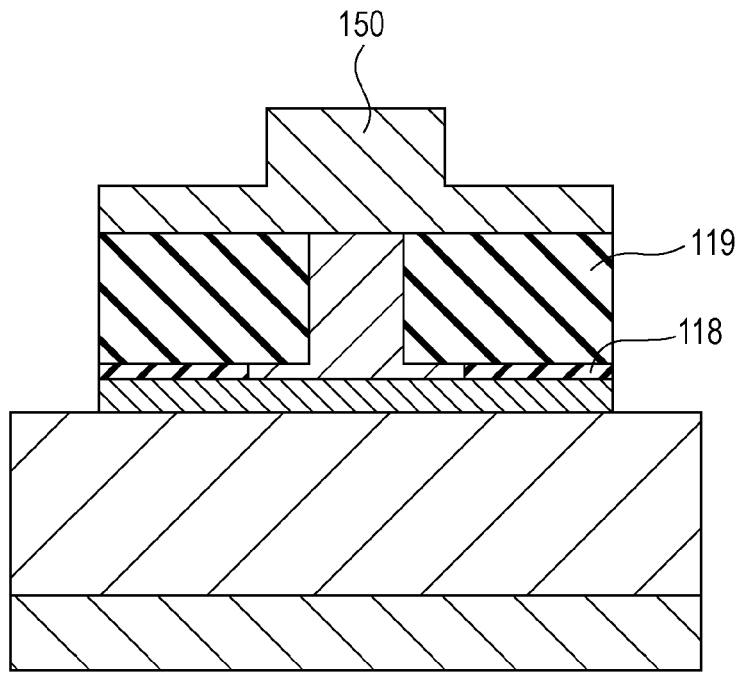
FIG. 14A illustrates a surface emitting lasers including different second transverse-mode-controlling mechanisms.
Figure 14B:
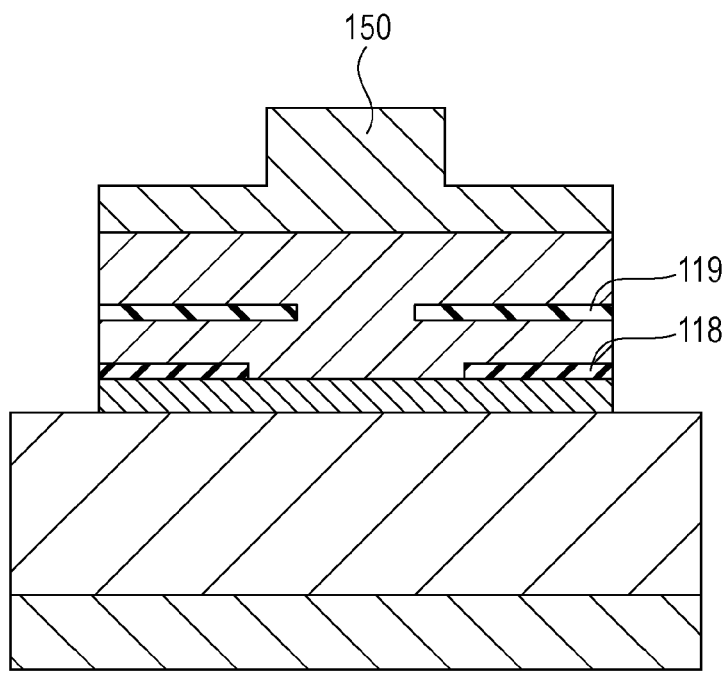
FIG. 14B illustrates a surface emitting lasers including different second transverse-mode-controlling mechanisms.

FIGS. 14A and 14B illustrate exemplary configurations each including a second current confinement structure 119 as the second transverse-mode-controlling mechanism. The second current confinement structure 119 may be an insulator formed by ion injection as illustrated in FIG. 14A or an additional oxidized confinement structure as illustrated in FIG. 14B.

Either of the two second current confinement structures 119 is provided on the front side of the current confinement structure 118 and confines the current in a narrower area than in the current confinement structure 118. With the presence of the second current confinement structure 119, the carrier distribution is controllable.

Second Embodiment

In the first embodiment, the stepped structure 150 is made of a single material. In a second embodiment of the present invention, the stepped structure 150 is made of a plurality of materials.

One of advantageous effects of the second embodiment is that the distribution of reflection coefficient and the distribution of transmission coefficient of the front mirror 116 (including the stepped structure 150) is controllable more freely with such a stepped structure 150.

Figure 13:
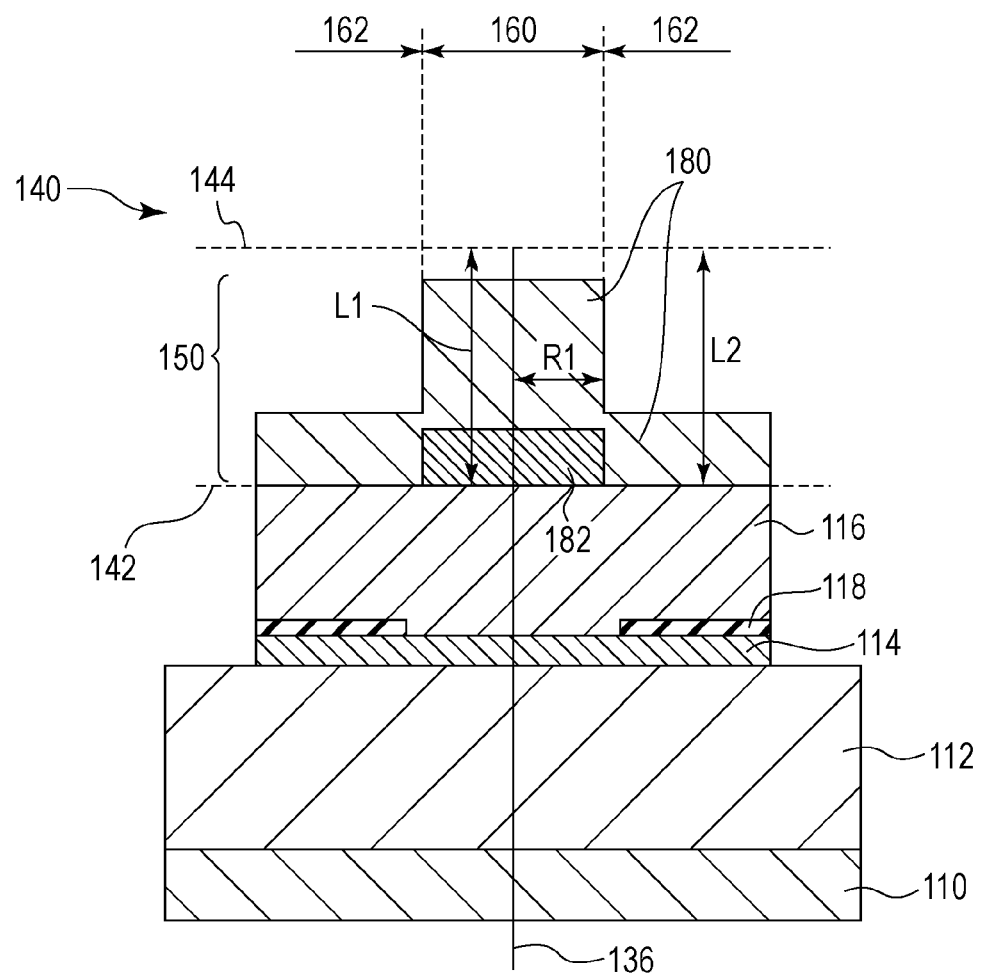
FIG. 13 illustrates a surface emitting laser including a stepped structure according to a second embodiment of the present invention made of two or more materials.

FIG. 13 illustrates a surface emitting laser including a stepped structure 150 made of a first material 180 and a second material 182 that have different refractive indices.

For example, the first material 180 is a dielectric and has a refractive index of about 1.5 to about 2.0, and the second material 182 is a semiconductor and has a refractive index of about 3.0 to about 3.5.

As with the first embodiment, to widen the spread angle of the FFP and to make the central part of the FFP flat, the phase difference θ between a transmitted ray in the first area 160 and a transmitted ray in the second area 162 needs to satisfy the following expression:

$$(1/4+N)2\pi < \theta < (3/4+N)2\pi$$

As with the first embodiment, in the second embodiment illustrated in FIG. 13, the optical path length L1 is the optical path length in the first area 160 from the front surface 142 of the front mirror 116 to the plane 144, and the optical path length L2 is the optical path length in the second area 162 from the front surface 142 to the plane 144. The plane 144 is a reference plane that is defined on the outside of the surface emitting laser and is perpendicular to the stacking direction in which the layers included in the surface emitting laser are stacked. The optical path difference L is expressed as |L1−L2|. Hence, the phase difference θ between the above transmitted rays is $-2\pi L/\lambda$.

The boundary between the first area 160 and the second area 162 is at a distance R1 from the optical axis 136 of the light source.

For example, suppose that the refractive indices of the first material 180 and the second material 182 are 1.5 and 3.0, respectively; the first material 180, which is a dielectric, and the second material 182, which is a semiconductor, are provided in the first area 160 with optical thicknesses of $1.0\lambda$ and $0.5\lambda$, respectively; and the first material 180, which is a dielectric, is provided in the second area 162 with an optical thickness of $0.5\lambda$. In such a configuration, the stepped structure 150 has a smaller thickness than the stepped structure 150 included in the surface emitting laser 100 according to the first embodiment that is made of a dielectric only. Thus, a stepped structure causing no reflectance distribution in the front mirror 116 and producing a phase difference of 180° between transmitted rays in different areas is provided. Consequently, the scattering loss is suppressed more than in the first embodiment.

For example, a film of the second material 182, i.e., a semiconductor film, is deposited on the front mirror 116 with an optical thickness of $0.5\lambda$, and a film of the first material 180, i.e., a dielectric film, is further deposited thereon with an optical thickness of $0.5\lambda$. After applying a resist to the resulting body, the resist is patterned and a portion of the dielectric film (the first material 180) in the second area 162 is etched. Subsequently, using the resulting dielectric film (the first material 180) as a mask, a portion of the semiconductor film (the second material 182) in the second area 162 is etched. Then, the resist is removed and another film of a dielectric material, i.e., the first material 180, is deposited with an optical thickness of $0.5\lambda$ over the entire surface of the resulting body. Thus, the stepped structure 150 illustrated in FIG. 13 is formed.

The stepped structure 150 according to the second embodiment may be formed through one continuous process including etching and lift-off, or through a plurality of processes.

For example, the second material 182 forming a portion of the stepped structure 150 may be provided before the current confinement structure 118 is formed, and the first material 180 forming the other portion of the stepped structure 150 may be subsequently provided after the current confinement structure 118 is formed.

Alternatively, the second material 182 forming a portion of the stepped structure 150 may be patterned together with the mesa structure by self-alignment, and, after the mesa structure and the current confinement structure 118 are formed, the first material 180 forming the other portion of the stepped structure 150 may be formed in the same manner as in the first embodiment.

The configuration according to the second embodiment is also applicable to the modifications of the first embodiment, in addition to the configuration illustrated in FIG. 1.

Third Embodiment

A third embodiment of the present invention concerns a surface emitting laser that includes a plurality of stepped structures having portions defined by individually different radii.

For example, the laser includes a stepped structure (a first stepped structure) that basically controls the far field complex amplitude and another stepped structure (a second stepped structure) that basically controls the reflectance distribution of the front mirror 116. The diameters of individual portions of the stepped structures are optimally changeable according to need. Herein, the reflectance of the front mirror 116 refers to the reflectance of a combination of the front mirror 116 and the stepped structures, as in the second embodiment.

Figure 15:
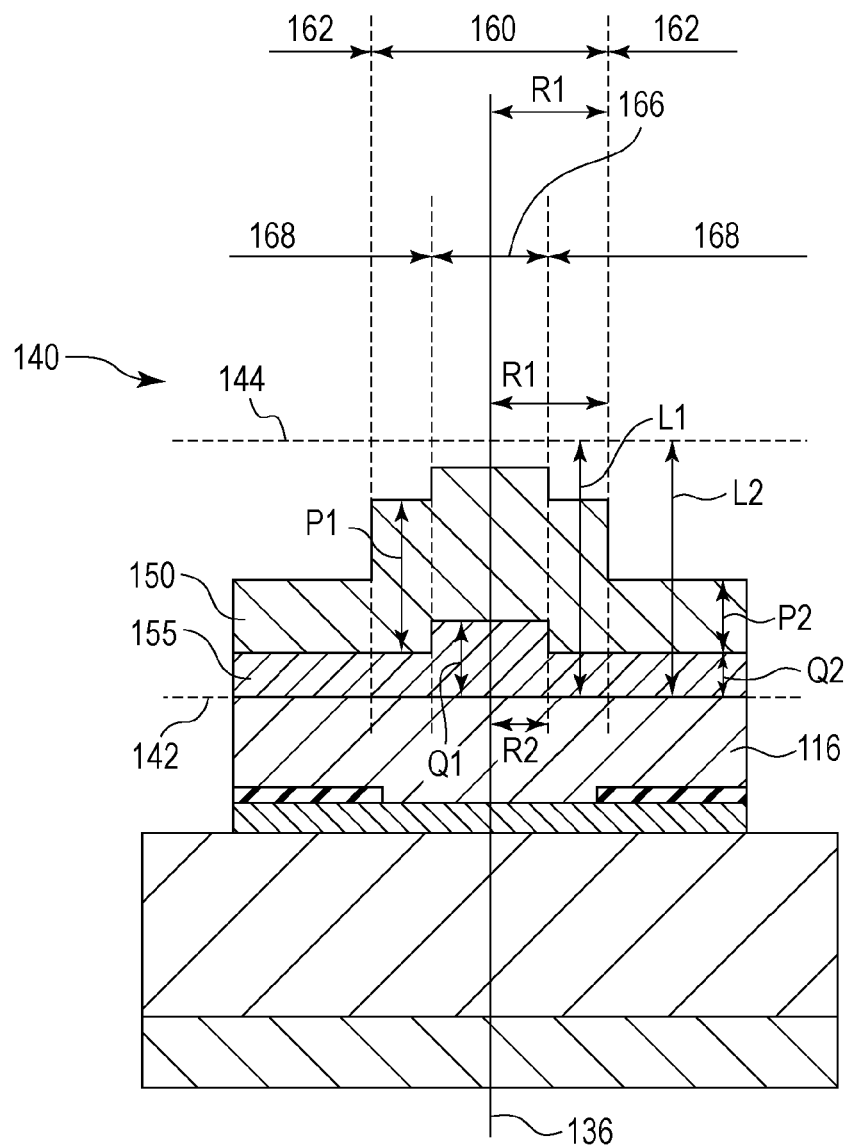
FIG. 15 illustrates a surface emitting laser including a stepped structure according to a third embodiment of the present invention.

FIG. 15 is a sectional view of the surface emitting laser including the two stepped structures. Specifically, a second stepped structure 155 that controls the reflectance and a first stepped structure 150 that controls the far field complex amplitude are sequentially stacked on the front mirror 116.

Let the refractive indices of a second material forming the second stepped structure 155 and a first material forming the first stepped structure 150 be $n_2$ and $n_1$, respectively. The second material is, for example, a semiconductor. The first material is, for example, a dielectric.

The second stepped structure 155 includes, in the emission area, a central portion (extending in a fourth area 166) and an outer portion (extending in a fifth area 168) that have different heights. Thus, the second stepped structure 155 has a smaller reflectance in the outer portion than in the central portion, and the transverse mode is controlled.

The second stepped structure 155 is formed by, for example, etching the outer portion of a film of the second material by an optical thickness that is an odd multiple of $\lambda/4$.

The first stepped structure 150 produces a large phase difference between rays transmitted through its central portion (extending in the first area 160) and its outer portion (extending in the second area 162), respectively, as with the stepped structure 150 according to the first embodiment.

The refractive index $n_1$ of the material (first material) forming the first stepped structure 150 and the refractive index $n_2$ of the material (second material) forming the second stepped structure 155 are different. For example, the first material is a dielectric composed of $SiO_2$ and has a refractive index $n_1$ of 1.5, and the second material is a semiconductor composed of $Al_{0.5}Ga_{0.5}As$ and has a refractive index $n_2$ of 3.3. Parameters of the two stepped structures 150 and 155 can be optimized, whereby the transverse mode and the far field complex amplitude are controlled.

The first stepped structure 150 and the second stepped structure 155 have different radii denoted by R1 and R2 in FIG. 15. For example, the radius R1 is 3.1 μm and the radius R2 is 2.3 μm.

The second stepped structure 155, made of the second material, is configured such that the difference in the length of the optical path, expressed as |Q1−Q2|, between the portions having different heights becomes an odd multiple of $\lambda/4$.

For example, $Q1=0.5\lambda/n_2$, and $Q2=0.25\lambda/n_2$.

Therefore, rays at a wavelength λ entering the central portion (extending in the fourth area 166) and the outer portion (extending in the fifth area 168), respectively, from the active layer and reflected at the interface between the second material and the first material are in opposite phase. Thus, the reflectance of the front mirror 116 becomes higher in the central portion (extending in the fourth area 166) than in the outer portion (extending in the fifth area 168).

The radius R2 of the second stepped structure 155 may be determined such that the occurrence of a substantial return loss in the fundamental mode is prevented while a return loss that suppresses the oscillation is made to occur in a higher-order mode.

Reducing the reflectance of the outer portion increases the transmittance of the outer portion.

For example, when the reflectance is reduced from 99.5% to 95%, the transmittance increases tenfold (the absolute value ratio of the transmission coefficient increases √10-fold).

Particularly, in a case where the second stepped structure 155 has a wide reflectance distribution, the quantity of light transmitted through the portion of the second stepped structure 155 in the fifth area 168 may become larger than the quantity of light transmitted through the portion of the second stepped structure 155 in the fourth area 166. In such a case, the first stepped structure 150 needs to be configured in such a manner as to produce a phase difference in the light transmitted through the portion of the second stepped structure 155 in the fifth area 168.

To do so, by producing a distribution of phase difference in the portion defined by the radius R1 that is larger than the radius R2, a phase difference is produced in at least the fifth area 168. Thus, a single-peak or flat far field intensity distribution is produced.

That is, as illustrated in FIG. 15, the first stepped structure 150 is configured such that at least a part around the boundary between the first area 160, having a large phase difference, and the second area 162 belongs to the fifth area 168.

In an area belonging to both of the first area 160 and the fifth area 168, let the optical path length from a rear surface 142 of the second stepped structure 155 to the plane 144 defined on the front side of the first stepped structure 150 be L1. Furthermore, in an area belonging to both of the second area 162 and the fifth area 168, let the optical path length from the surface 142 to the plane 144 be L2. Then, actual thicknesses P1 and P2 of the first stepped structure 150 are determined such that a phase difference θ of 90° to 270° is produced between the area defined by the optical path length L1 and the area defined by the optical path length L2.

The radius R1 of the first stepped structure 150 can be designed such that the spread angle of the FFP of the fundamental mode is widened and the central part of the FFP becomes flat. Here, let the refractive index of the environmental medium 140 in which the surface emitting laser is installed be $n_0$ (for example, when the environmental medium 140 is air, $n_0=1$). Then, L1−L2 is expressed as $(n_1-n_0) \times (P1-P2)$.

If "$n_1 \times P1$" and "$n_1 \times P2$" are each defined as an optical thickness that is an integral multiple of $\lambda/2$, the first stepped structure 150 produces no reflectance distribution. This condition is satisfied when, for example, $P1=2\lambda/n_1$ and $P2=0.5\lambda/n_1$.

It is desirable that the reflectance in the area belonging to both of the fifth area 168 and the second area 162 be not low because the area greatly influences the shape of the far field complex amplitude. In contrast, it is desirable that the reflectance in the area belonging to both of the fifth area 168 and the first area 160 be relatively low for the convenience of controlling the transverse mode. That is, a part of the fifth area 168 belonging to the second area 162 (an outer part of the fifth area 168) is desired to have a higher reflectance than a part of the fifth area 168 belonging to the first area 160 (an inner part of the fifth area 168), as described above.

When "$n_1 \times P2$" is not an integral multiple of $\lambda/2$, the reflectance of a portion of the front mirror 116 in the second area 162 can be periodically modulated in accordance with the optical path length. Particularly, if "$n_1 \times P2$" is set to an odd multiple of $\lambda/4$, the reflectance in the area belonging to both of the fifth area 168 and the second area 162 becomes higher than the reflectance in the area belonging to both of the fifth area 168 and the first area 160.

Fourth Embodiment

A fourth embodiment of the present invention concerns a combination of the second and third embodiments.

Specifically, a surface emitting laser according to the fourth embodiment includes a plurality of stepped structures including portions defined by individually different radii. At least one of the stepped structures is made of a plurality of materials.

Figure 16A:
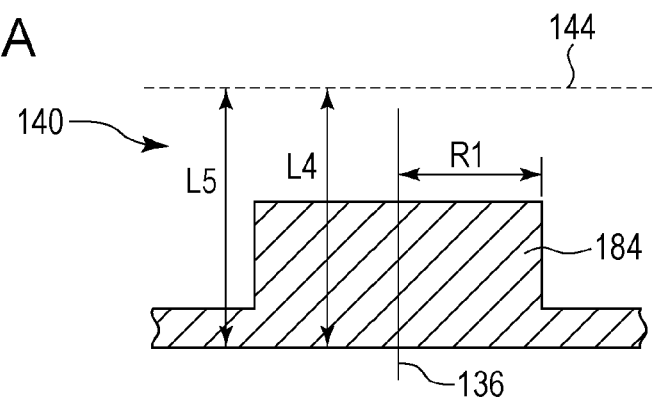
FIG. 16A illustrates a surface emitting laser including a stepped structure according to a fourth embodiment of the present invention.
Figure 16B:
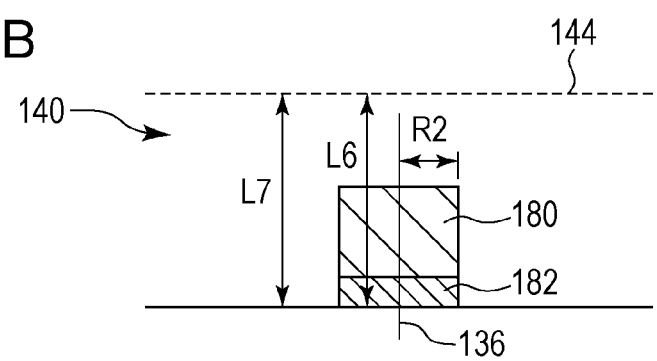
FIG. 16B illustrates a surface emitting laser including a stepped structure according to a fourth embodiment of the present invention.
Figure 16C:
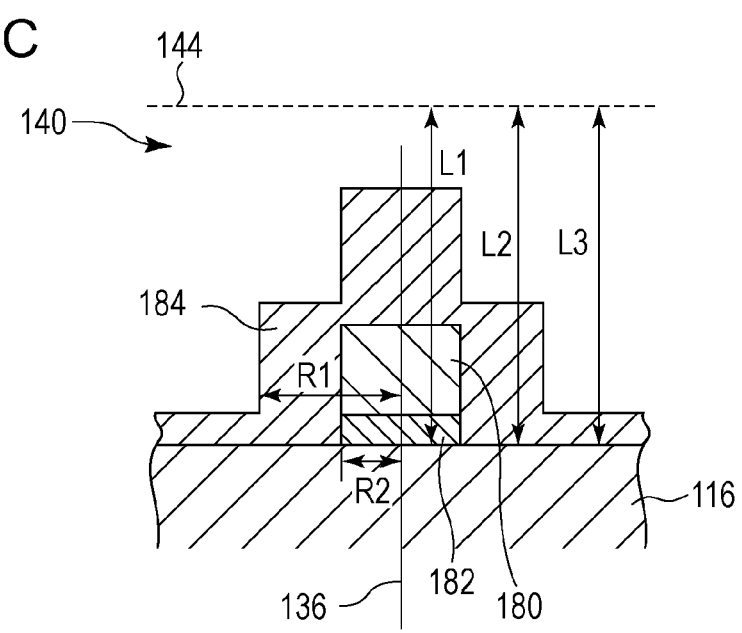
FIG. 16C illustrates a surface emitting laser including a stepped structure according to a fourth embodiment of the present invention.

FIGS. 16A and 16B illustrate a first stepped structure and a second stepped structure, respectively. FIG. 16C is a schematic sectional view of the first and second stepped structures illustrated in FIGS. 16A and 16B that are stacked one on top of the other on the front mirror 116 of the surface emitting laser.

The second stepped structure illustrated in FIG. 16B is made of a plurality of materials having different refractive indices, specifically, a first material 180 and a second material 182.

For example, the second material 182 is a semiconductor and has a refractive index of 3, and the first material 180 is a dielectric and has a refractive index of 1.5.

The second stepped structure has, for example, a cylindrical shape with a radius R2.

As illustrated in FIG. 16B, different optical path lengths from the rear surface of the second stepped structure to the plane 144 defined on the front side of the second stepped structure are denoted by L6 and L7, respectively.

There is a large difference in refractive index between the second material 182 and the first material 180. The difference in refractive index greatly influences the reflectance of the front mirror 116. For example, when the optical thickness of the second material 182 is set to an odd multiple of $\lambda/4$, a reflectance distribution is produced in the front mirror 116.

The thickness of the first material 180 is set such that the difference between the optical path lengths L6 and L7 becomes $\lambda/2$.

Here, suppose that the refractive index of the environmental medium 140 is 1 and the optical thickness of the first material 180 is $\lambda$. In this case, the following holds: L6−L7= $(3-1)/3 \cdot \lambda/4 + (1.5-1)/1.5 \cdot \lambda = \lambda/2$. That is, the second stepped structure is configured such that the near field complex amplitude has a distribution of phase difference $\pi$.

The first stepped structure illustrated in FIG. 16A is made of a third material 184. The third material 184 is, for example, a dielectric and has a refractive index of 1.7. The third material 184 may be the same as the first material 180.

The first stepped structure has, for example, a cylindrical shape with a radius R1 that is larger than the radius R2.

As illustrated in FIG. 16A, different optical path lengths from the rear surface of the first stepped structure to the plane 144 defined on the front side of the first stepped structure are denoted by L4 and L5, respectively.

The third material 184 is provided such that the difference between the optical path lengths L4 and L5 in portions thereof having different heights becomes $\lambda/2$.

Here, suppose that the refractive index of the environmental medium 140 is 1 and the optical thickness corresponding to the height difference in the third material 184 is 1.5$\lambda$. In this case, the following holds: L4−L5=$(1.5-1)/1.5 \cdot 1.5\lambda = \lambda/2$. That is, the first stepped structure is configured such that the near field complex amplitude has a distribution of phase difference $\pi$.

The first and second stepped structures are stacked on the front mirror 116 as illustrated in FIG. 16C. The axes of the two stepped structures coincide with each other.

Furthermore, the resonance mode is symmetric with respect to the optical axis 136. The axes of the first and second stepped structures coincide with the symmetry axis of the resonance mode.

Since the first stepped structure is stacked over the second stepped structure, a step is formed in an area defined by the radius R2. Nevertheless, the optical thickness distribution of each of the stepped structures is maintained.

Referring to FIG. 16C, different optical thicknesses from the interface between the front mirror 116 and the second stepped structure to the plane 144 defined on the front side of the first stepped structure are denoted by L1, L2, and L3, respectively.

With the presence of the second stepped structure, the reflectance is lower and the transmittance is higher in an area on the outer side of the area defined by the radius R2 than in the area defined by the radius R2. An additional large phase difference is produced in the portion of the first stepped structure having the higher transmittance. Therefore, the FFP is widened.

Furthermore, since L1−L2=$\lambda/2$ and L2−L3=$\lambda/2$, L1−L3=$\lambda$.

In a case where the resonance mode is symmetric with respect to the optical axis 136 and the wavefront is flat, if the stepped structure has a symmetric shape and differences in optical thickness between respective pairs of adjacent portions are all integral multiples of 0.5$\lambda$, the stepped structure gives a resonance mode a distribution of phase differences that are 0 and $\pi$ in an area based on scalar diffraction approximation. In such a case, according to the symmetry of Fourier transformation, the far field complex amplitude determined by the near field complex amplitude modulated by the above stepped structure does not have any phase difference distribution around the center thereof. Thus, a surface emitting laser having an FFP that is particularly suitable as a light source intended for electrophotographic apparatuses is provided.

Figure 17A:
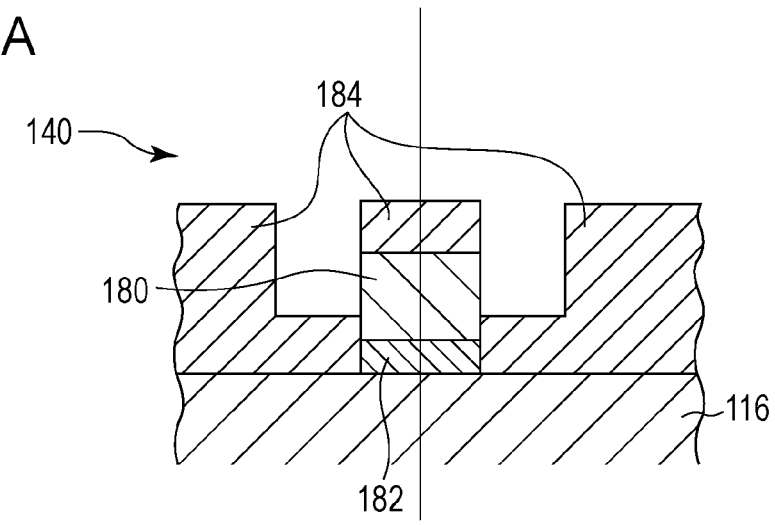
FIG. 17A illustrates a surface emitting laser including stepped structures according to modifications of the fourth embodiment of the present invention.
Figure 17B:
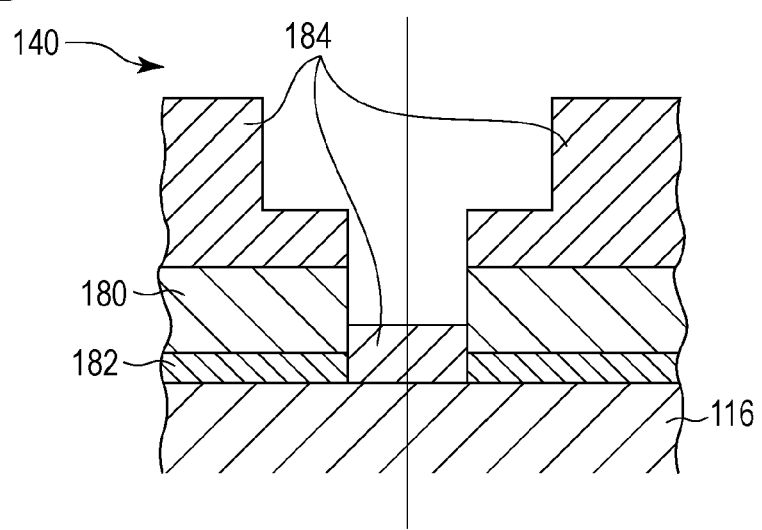
FIG. 17B illustrates a surface emitting laser including stepped structures according to modifications of the fourth embodiment of the present invention.
Figure 17C:
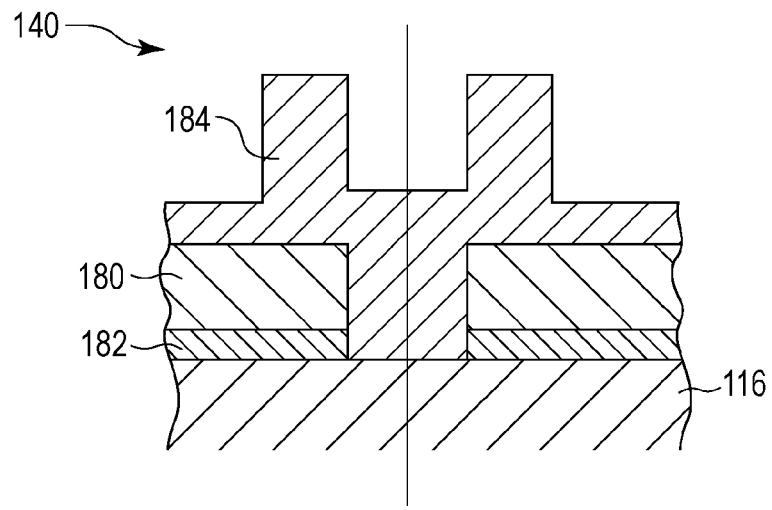
FIG. 17C illustrates a surface emitting laser including stepped structures according to modifications of the fourth embodiment of the present invention.

In the above combination of the first and second stepped structures, the distribution of optical path length has a convex shape. There are other possible combinations such as a combination of a second stepped structure having a convex shape and a first stepped structure having a concave shape as illustrated in FIG. 17A, a combination of a second stepped structure having a concave shape and a first stepped structure having a concave shape as illustrated in FIG. 17B, and a combination of a second stepped structure having a concave shape and a first stepped structure having a convex shape as illustrated in FIG. 17C.

Fifth Embodiment

A fifth embodiment of the present invention concerns an application of any of the surface emitting lasers according to the first to fourth embodiments to an image forming apparatus including a surface-emitting-laser-array light source and a scanning device. The surface-emitting-laser-array light source includes a plurality of surface emitting lasers.

FIGS. 18A, 18B, 19A, and 19B illustrate an electrophotographic image forming apparatus including a surface-emitting-laser-array light source 514.

Figure 18A:
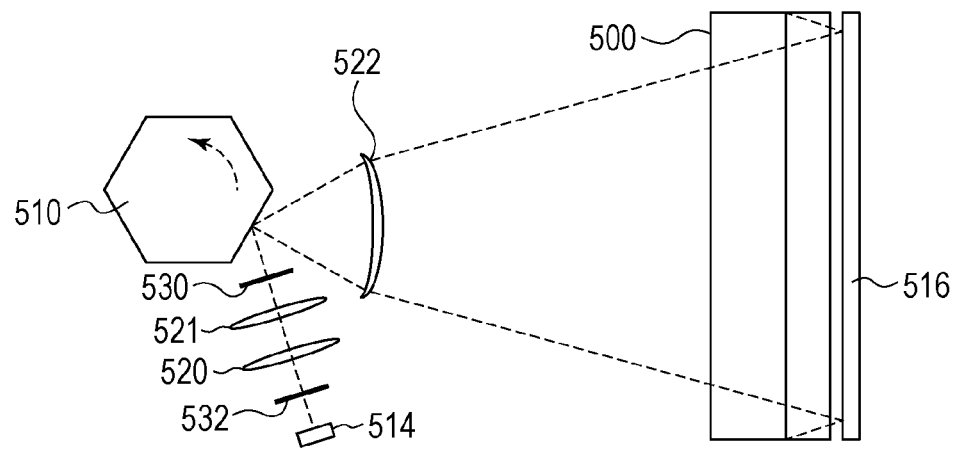
FIG. 18A illustrates an image forming apparatus including a surface-emitting-laser array having any of the stepped structures according to the first to fourth embodiments.
Figure 18B:
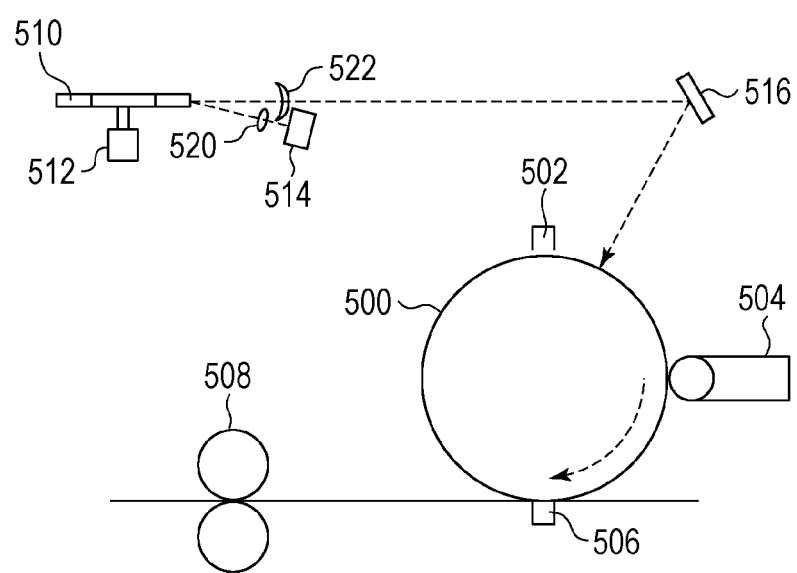
FIG. 18B illustrates an image forming apparatus including a surface-emitting-laser array having any of the stepped structures according to the first to fourth embodiments.
Figure 19A:
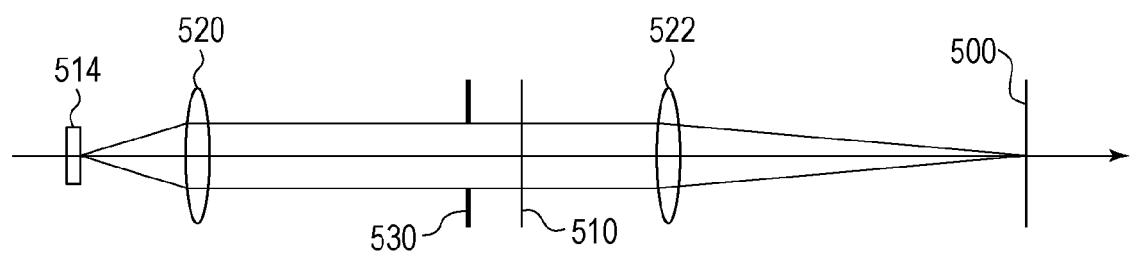
FIG. 19A illustrates the image forming apparatus.
Figure 19B:
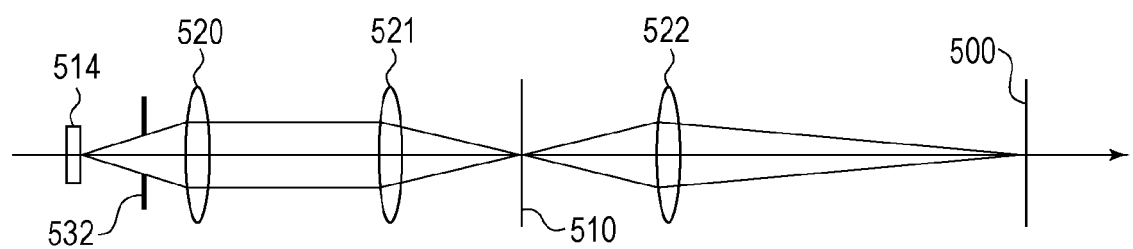
FIG. 19B illustrates the image forming apparatus.

FIGS. 18A and 18B are a plan view and a side view, respectively, of the image forming apparatus. FIGS. 19A and 19B schematically illustrate the arrangement of optical members in a main scanning direction and in a sub-scanning direction, respectively.

Elements illustrated in FIGS. 18A to 19B include a photosensitive drum 500, a charging device 502, a developing device 504, a transfer charging device 506, a fixing device 508, a rotating polygon mirror 510, a motor 512, the surface-emitting-laser-array light source 514, a reflective mirror 516, a collimator lens 520, a cylindrical lens 521, and an f-θ lens 522. The surface-emitting-laser-array light source 514 causes linear polarization. The direction of linear polarization is, for example, parallel to the main scanning direction.

The motor 512 illustrated in FIG. 18B drives the polygon mirror 510 to rotate.

In the fifth embodiment, the polygon mirror 510 has, for example, six reflective surfaces.

The surface-emitting-laser-array light source 514 is intended for recording and is configured to be turned on or off by a driver in accordance with an image signal. A laser beam thus modulated is transmitted through the collimator lens 520, which focuses the beam from the surface-emitting-laser-array light source 514, and travels toward the polygon mirror 510.

Referring to FIG. 19A, a main-scan aperture stop 530 is provided on the optical axis between the collimator lens 520 and the polygon mirror 510. The main-scan aperture stop 530 is positioned as close to the polygon mirror 510 as possible so that individual rays from the surface-emitting-laser-array light source 514 uniformly strike each one of the reflective surfaces of the polygon mirror 510.

Referring to FIG. 19B, a sub-scan aperture stop 532 is provided between the surface-emitting-laser-array light source 514 and the cylindrical lens 521 and at a position that is conjugate to the center of the f-θ lens 522. The entrance pupil is determined by the above optical members and the aperture stops.

The polygon mirror 510 rotates in the direction of the arrow illustrated in FIG. 18A. While the polygon mirror 510 rotates, the laser beam emitted from the surface-emitting-laser-array light source 514 is deflected at a continuously changing angle by the successively provided reflective surfaces of the polygon mirror 510. The deflected beam is transmitted through the f-θ lens 522, where distortion and the like of the beam are corrected, and is subsequently reflected by the reflective mirror 516 in such a manner as to fall onto the photosensitive drum 500. Thus, the beam falling on the photosensitive drum 500 is scanningly moved in the main scanning direction. In this case, a beam reflected by each of the reflective surfaces of the polygon mirror 510 forms, on the photosensitive drum 500, an image composed of a plurality of lines extending in the main scanning direction and corresponding to the arrangement of the surface-emitting-laser-array light source 514.

The photosensitive drum 500 is charged in advance by the charging device 502 and is exposed to the scanningly moved laser beam, whereby an electrostatic latent image is formed thereon. The photosensitive drum 500 rotates in the direction of the arrow illustrated in FIG. 18B. The electrostatic latent image formed on the photosensitive drum 500 is developed into a visible image by the developing device 504. The visible image is transferred to transfer paper by the transfer charging device 506. The transfer paper having the visible image is conveyed to the fixing device 508, where fixing is performed thereon. Subsequently, the paper having the fixed image is discharged to the outside of the apparatus.

The individual surface emitting lasers included in the surface-emitting-laser-array light source 514 each have on the output surface thereof a cylindrical stepped structure 150 (having a radius a) illustrated in any of FIG. 1 and other drawings. If the stepped structure 150 is anisotropic in the radial direction, the smallest radius is defined as a.

The stepped structure 150 produces a phase difference π. Particularly, if the stepped structure 150 is anisotropic in the radial direction, the phase difference produced by the stepped structure 150 so as to suppress astigmatism is desirably π.

Figure 20:
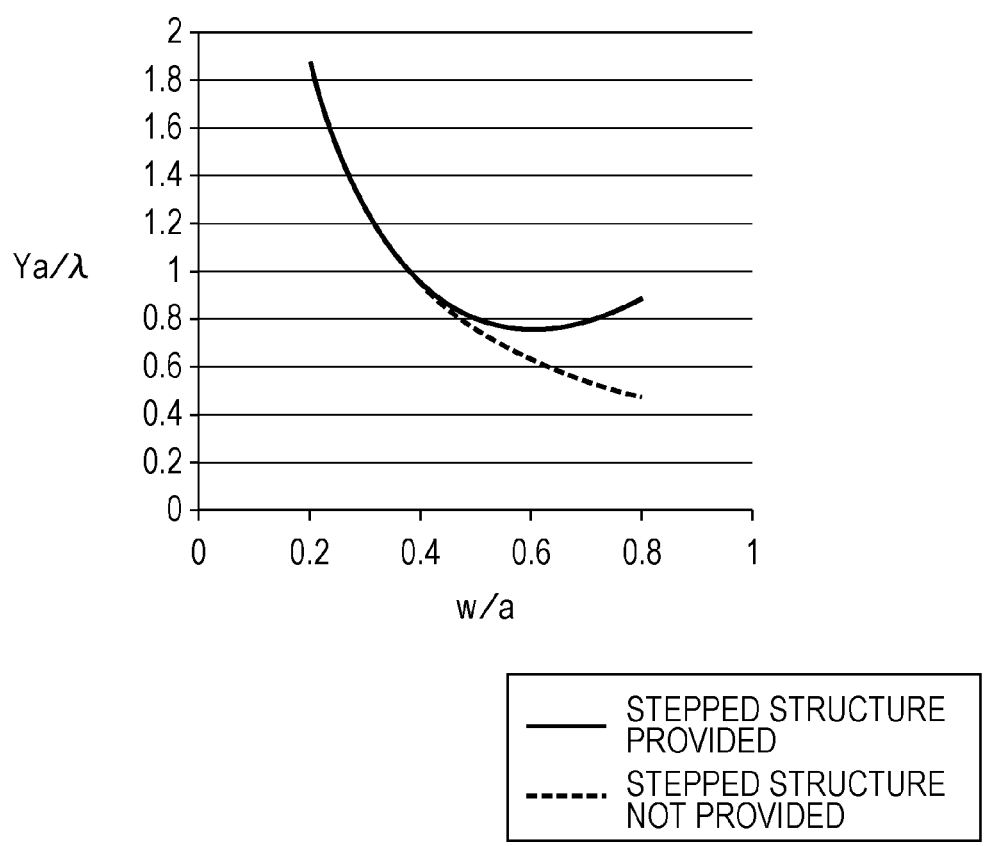
FIG. 20 is a graph illustrating the relationship between a beam radius w and the full width at half maximum of the FFP.
Figure 21:
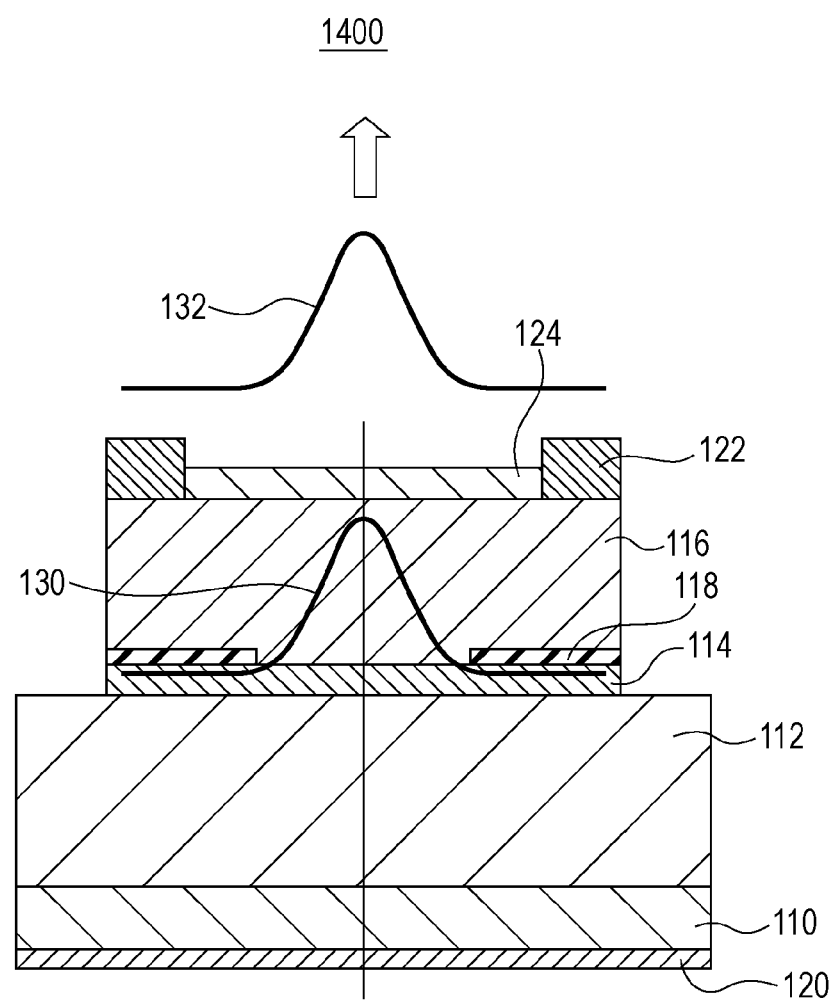
FIG. 21 is a schematic sectional view of a known surface emitting laser.
Figure 23A:
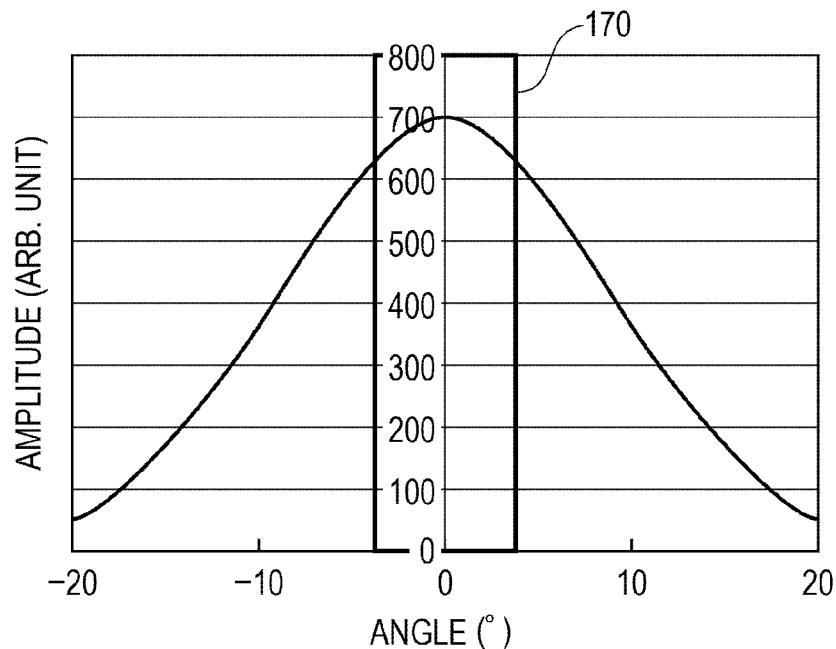
FIG. 23A illustrates the influence upon the spread angle and axial position of the FFP in the known surface emitting laser.
Figure 23B:
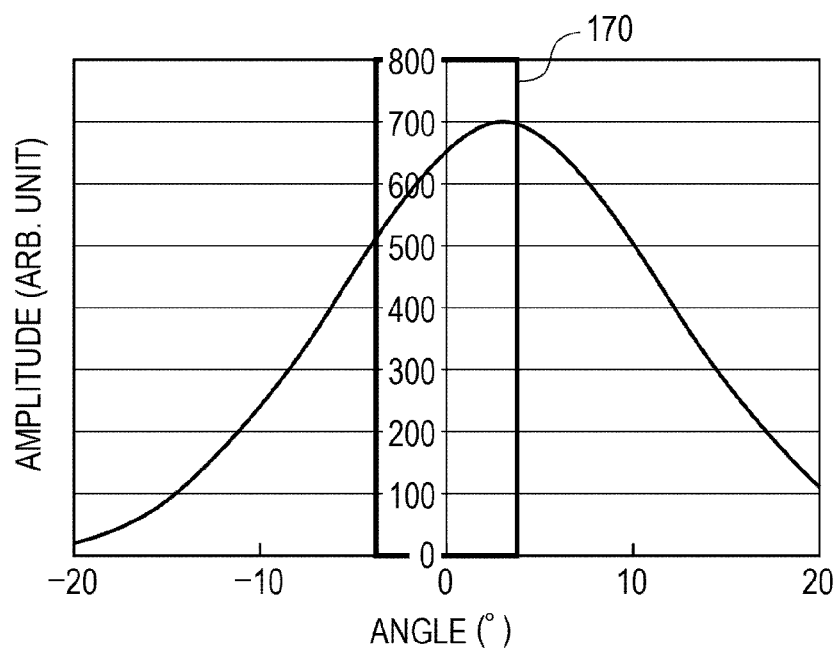
FIG. 23B illustrates the influence upon the spread angle and axial position of the FFP in the known surface emitting laser.
Figure 23C:
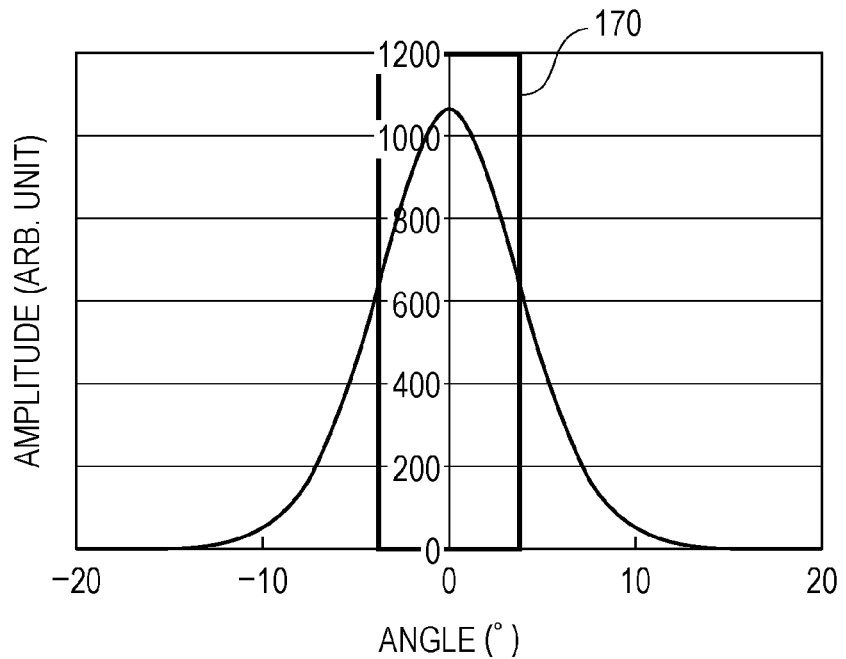
FIG. 23C illustrates the influence upon the spread angle and axial position of the FFP in the known surface emitting laser.
Figure 23D:
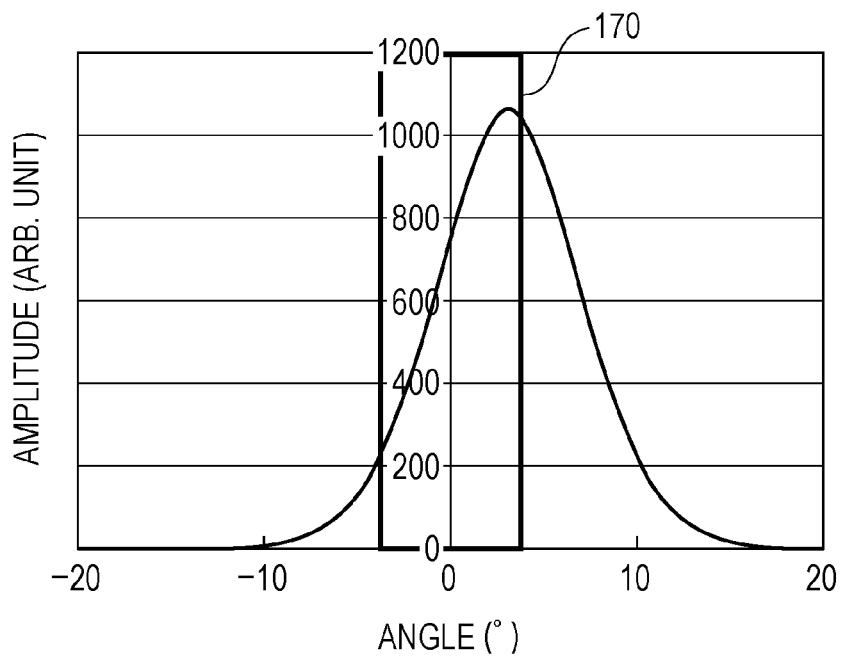
FIG. 23D illustrates the influence upon the spread angle and axial position of the FFP in the known surface emitting laser.

FIG. 20 is a graph illustrating the relationship between the beam radius w and the full width at half maximum of the FFP of the resonance mode in the above case. The resonance mode is assumed to be Gaussian, as described in the first embodiment. In a case where no stepped structure is provided, the beam radius w and the FFP are inversely correlated with each other, and the following holds: $Y(rad) = (2 \log 2)^{1/2} \lambda / \pi w = 0.37 \times \lambda / w$.

In a case where the stepped structure 150 is provided, there is a point where the full width at half maximum of the FFP is the smallest in an area defined by w/a<0.8 (an area where the FFP has a single peak). At this point, Y is about 0.75λ/a.

To stabilize the radius of the spot that forms an image, the FFP of the surface-emitting-laser-array light source 514 desirably has a full width at half maximum exceeding the entrance-side angular aperture (the angle spreading from the light source with respect to the optical axis and defining the diameter of the entrance pupil) of the optical scanning system. If the FFP of the surface-emitting-laser-array light source 514 has a full width at half maximum smaller than the entrance-side angular aperture, the spot radius becomes large and unstable.

That is, an entrance-side F-number Fno. of the optical system is desirably (0.75λ/a)>(1/Fno.). Hence, desirably, a<0.75λ·Fno. If the F-number for main scan and the F-number for sub-scan are different, the smaller value is taken as Fno. If the radius of the stepped structure is anisotropic, the smallest radius is taken as a.

Unless the width of the resonance mode is too large (larger than or equal to 0.8 times the radius of the stepped structure 150), the FFP of the above surface emitting laser has a half width larger than the diameter of the entrance pupil.

With a stepped structure having a radius corresponding to the size of the entrance pupil, the half width of the FFP increases. Consequently, an image forming spot whose size is stable is provided.

The stepped structure may be anisotropic in a direction parallel to a plane containing the main scanning direction and the sub-scanning direction. In such a case, to widen the FFP, the radius of the stepped structure is reduced in a direction contained in the foregoing plane and in which the F-number is smaller (the direction in which the angular aperture is larger).

That is, if the entrance-side F-numbers in the main scanning direction and the sub-scanning direction are different, the radii of the stepped structure in the main scanning direction and the sub-scanning direction is desirably set to different values. Thus, while the stability of the image forming spot is maintained, the amount of vignetting by the aperture stops is reduced, and the laser beam is efficiently focused on the scanning surface.

Therefore, in an image forming apparatus in which the entrance-side F-number in the sub-scanning direction is large, if laser elements of a surface-emitting-laser array each include a stepped structure having an elliptic shape, the major axis of the elliptic shape desirably extends in a direction in which the laser elements of the laser array are provided at regular intervals (the sub-scanning direction).

In an image forming apparatus in which the entrance-side F-number in the sub-scanning direction is small, the minor axis of the elliptic shape desirably extends in the sub-scanning direction.

That is, in a surface-emitting-laser array in which a plurality of laser elements are provided at regular intervals in a first direction, a portion of each first stepped structure in the first area desirably has an elliptic shape, with the minor or major axis of the elliptic shape coinciding with the first direction.

As a numerical example, in a case where each surface emitting laser has a symmetric cylindrical shape as in the first embodiment illustrated in FIG. 1, suppose that the wavelength λ is 680 nm, the radius a of the stepped structure is 3.8 µm, the optical path difference corresponding to the height difference in the stepped structure is 0.5λ, and the entrance-side F-number is 10. If no stepped structure is provided, the full width at half maximum Y of the FFP is about 0.084 rad when w=3.0 µm. Therefore, depending on the beam size, the far field intensity may become lower than half the peak intensity at some point within the entrance pupil.

In contrast, by providing the above stepped structure, the full width at half maximum of the FFP is widened to Y>0.13. Hence, the far field intensity within the entrance pupil is maintained to be at or above half the peak intensity. Consequently, an image forming apparatus in which the stability in the formation of an electrostatic latent image is improved is provided.

In the above description of the embodiments, items concerning the surface emitting laser are also true in an image forming apparatus including the surface emitting laser.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A surface emitting laser configured to oscillate at a wavelength λ, comprising:
   a substrate;
   a multilayer structure provided on the substrate and in which layers including a rear mirror, an active layer, and a front mirror are stacked;
   a first stepped structure provided over a front surface of the front mirror and including a first portion extending in a first area defined in a central part of an emission area and a second portion extending in a second area defined on the outer side of the first area within the emission area, the first and second portions having different heights; and
   a second stepped structure provided between the first stepped structure and the front mirror, and including a third portion extending in a third area defined in the central part of the emission area and a fourth portion extending in a fourth area defined on the outer side of the third area,
   wherein, in terms of an optical path length from a plane defined on the outside of the surface emitting laser and extending perpendicular to a stacking direction of the multilayer structure to the front surface of the front mirror, a difference L between the optical path length in the first area and the optical path length in the second area satisfies the following expression:

$(1/4+N)\lambda < |L| < (3/4+N)\lambda$ where N is an integer,
   wherein a refractive index of a material forming the second stepped structure is different from a refractive index of a material forming the first stepped structure, and
   wherein a reflectance of a structure, including the front mirror, the first stepped structure and the second stepped structure, is higher in a portion corresponding to the third area than in a portion corresponding to the fourth area.

2. The surface emitting laser according to claim 1, wherein the difference L satisfies the following expression:

$(0.36+N)\lambda < |L| < (0.64+N)\lambda$ where N is an integer.

3. The surface emitting laser according to claim 1, wherein the difference L satisfies the following expression:

$(0.39+N)\lambda < |L| < (0.61+N)\lambda$ where N is an integer.

4. The surface emitting laser according to claim 1, wherein the third and fourth portions have different heights.

5. The surface emitting laser according to claim 1, wherein at least a part around a boundary between the first area and the second area belongs to the fourth area.

6. A surface-emitting-laser array comprising:
   a plurality of surface emitting lasers according to claim 1.

7. The surface-emitting-laser array according to claim 6 wherein the plurality of surface emitting lasers are provided at regular intervals in a first direction, and
   wherein the first portion has an elliptic shape whose minor axis or major axis extends in the first direction.

8. An image forming apparatus comprising:
   a surface emitting laser according to claim 1; and
   an optical system configured to focus light from the surface emitting laser and to perform scanning with the light.

9. The image forming apparatus according to claim 8, wherein a radius a of the first portion satisfies the following expression:

$a < 0.75\lambda \cdot Fno.$ where Fno. denotes the entrance-side F-number of the optical system.

10. The image forming apparatus according to claim 9, wherein the first stepped structure has different radii in a main scanning direction corresponding to a direction in which the scanning is performed by the optical system and in a sub-scanning direction perpendicular to the main scanning direction, and
    wherein the radius in one of the directions in which the entrance-side F-number of the optical system is small is smaller than the radius in the other direction in which the entrance-side F-number of the optical system is large.

11. The surface emitting laser according to claim 1, wherein a difference between an optical path length of the third area and an optical path length of the fourth area is an odd multiple of λ/4.

12. The surface emitting laser according to claim 1, wherein the refractive index of the material forming the second stepped structure is higher than the refractive index of the material forming the first stepped structure.

* * * * *